United States Patent
Kitagawa et al.

(10) Patent No.: US 8,502,331 B2
(45) Date of Patent: Aug. 6, 2013

(54) MAGNETORESISTIVE EFFECT ELEMENT, MAGNETIC MEMORY

(75) Inventors: Eiji Kitagawa, Yokohama (JP); Tadaomi Daibou, Yokohama (JP); Yutaka Hashimoto, Kawasaki (JP); Masaru Tokou, Yokohama (JP); Tadashi Kai, Tokyo (JP); Makoto Nagamine, Tokyo (JP); Toshihiko Nagase, Yokohama (JP); Katsuya Nishiyama, Yokohama (JP); Koji Ueda, Kamakura (JP); Hiroaki Yoda, Kawasaki (JP); Kay Yakushiji, Tsukuba (JP); Shinji Yuasa, Tsukuba (JP); Hitoshi Kubota, Tsukuba (JP); Taro Nagahama, Tsukuba (JP); Akio Fukushima, Tsukuba (JP); Koji Ando, Tsukuba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 68 days.

(21) Appl. No.: 13/234,720

(22) Filed: Sep. 16, 2011

(65) Prior Publication Data
US 2012/0068285 A1    Mar. 22, 2012

(30) Foreign Application Priority Data
Sep. 17, 2010    (JP) .................................. 2010-210180

(51) Int. Cl.
*H01L 29/82* (2006.01)

(52) U.S. Cl.
USPC ............ 257/421; 257/E29.323; 257/E21.665; 365/34; 438/3

(58) Field of Classification Search
USPC .. 257/421, E29.323, E21.665; 438/3; 365/34, 365/55, 209
See application file for complete search history.

(56) References Cited

U.S. PATENT DOCUMENTS

| | | | |
|---|---|---|---|
| 6,844,605 B2 * | 1/2005 | Nishimura | .................... 257/421 |
| 2009/0080238 A1 | 3/2009 | Yoshikawa et al. | |
| 2010/0080050 A1 | 4/2010 | Ozeki et al. | |
| 2011/0310660 A1 | 12/2011 | Yamada et al. | |

FOREIGN PATENT DOCUMENTS

| | | |
|---|---|---|
| EP | 2 375 464 A1 | 12/2011 |
| JP | 63-019886 A | 1/1988 |
| JP | 2009-081216 | 4/2009 |
| JP | 2010-080746 A | 4/2010 |
| JP | 2011-155073 | 8/2011 |
| WO | WO 2010/073790 | 7/2010 |

OTHER PUBLICATIONS

Japanese Office Action dated Sep. 11, 2012 for Japanese Application No. 2010-210180 filed on Sep. 17, 2010.

M. Nakayama et al., "Spin Transfer Switching in TbCoFe/CoFeB/MgO/CoFeB/TbCoFe Magnetic Tunnel Junctions with Perpendicular Magnetic Anisotropy," Journal of Applied Physics, vol. 103. 07A710 (2008).

* cited by examiner

*Primary Examiner* — Tucker Wright
(74) *Attorney, Agent, or Firm* — Knobbe, Martens, Olson & Bear, LLP

(57) ABSTRACT

According to one embodiment, a magnetoresistive effect element includes a first magnetic layer including perpendicular anisotropy to a film surface and an invariable magnetization direction, the first magnetic layer having a magnetic film including an element selected from a first group including Tb, Gd, and Dy and an element selected from a second group including Co and Fe, a second magnetic layer including perpendicular magnetic anisotropy to the film surface and a variable magnetization direction, and a nonmagnetic layer between the first magnetic layer and the second magnetic layer. The magnetic film includes amorphous phases and crystals whose particle sizes are 0.5 nm or more.

14 Claims, 16 Drawing Sheets

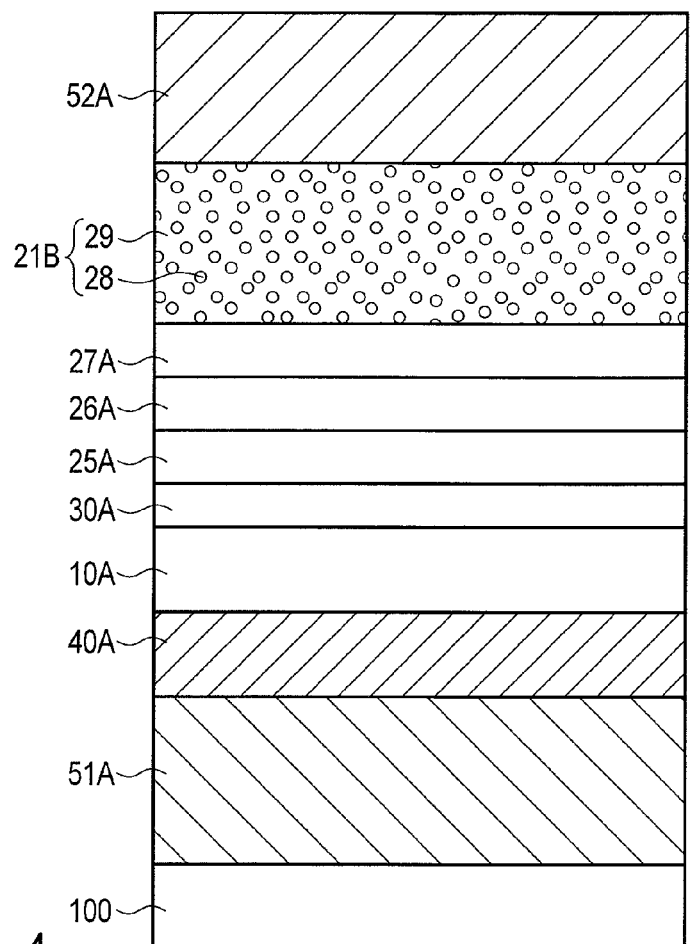
F I G. 4
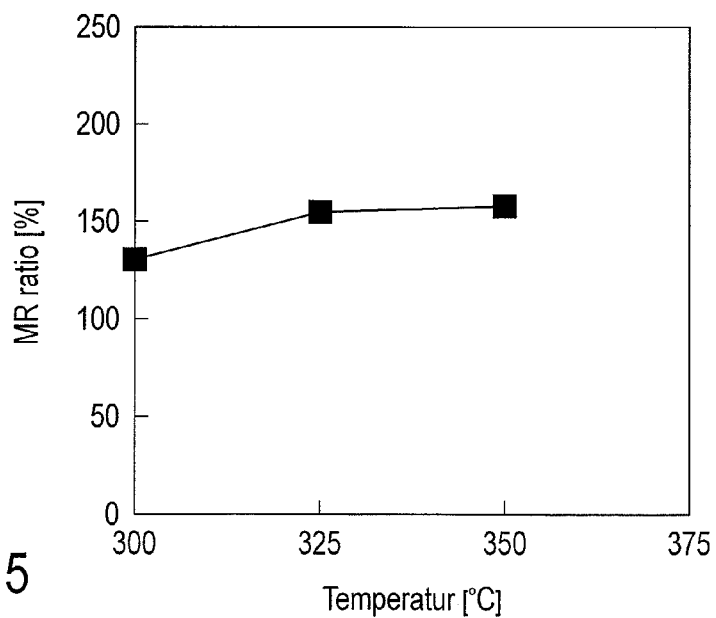
F I G. 5

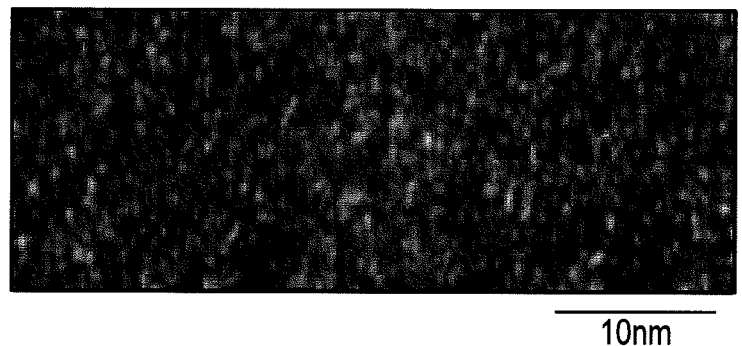
F I G. 6A
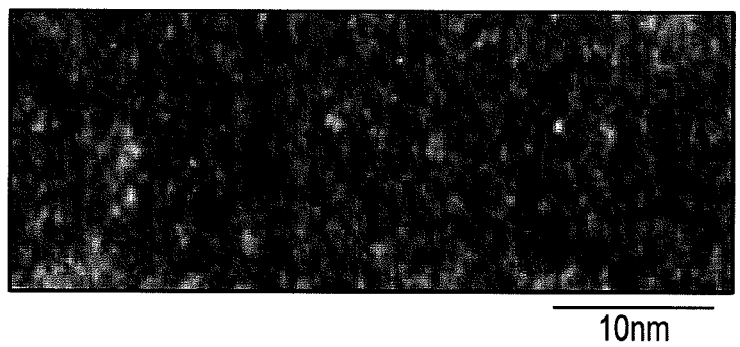
F I G. 6B
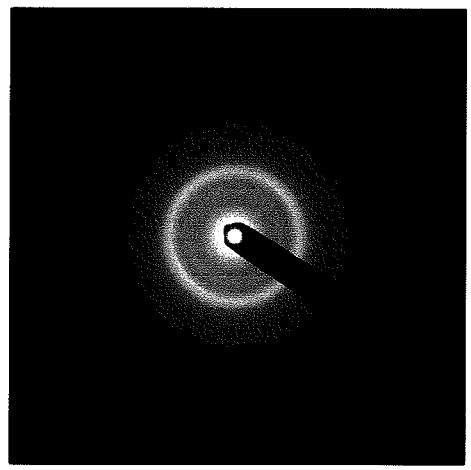
F I G. 7

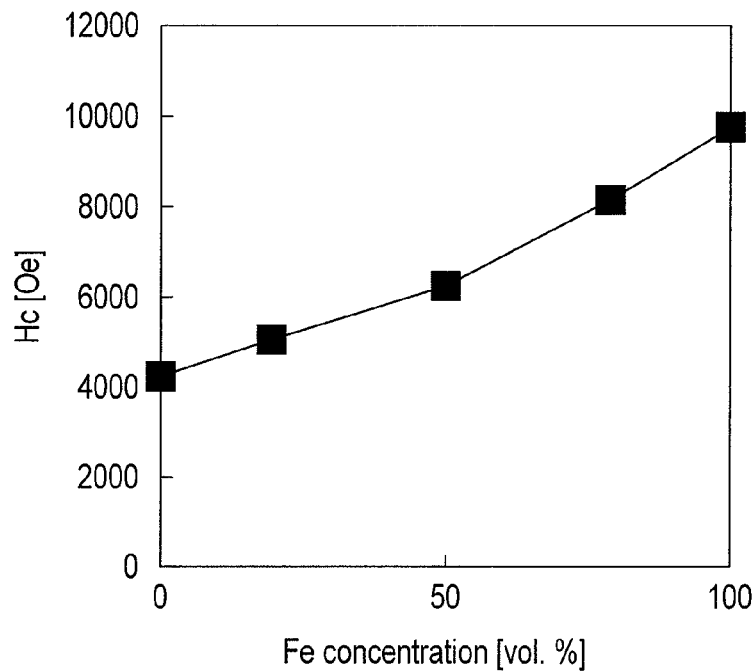
F I G. 8
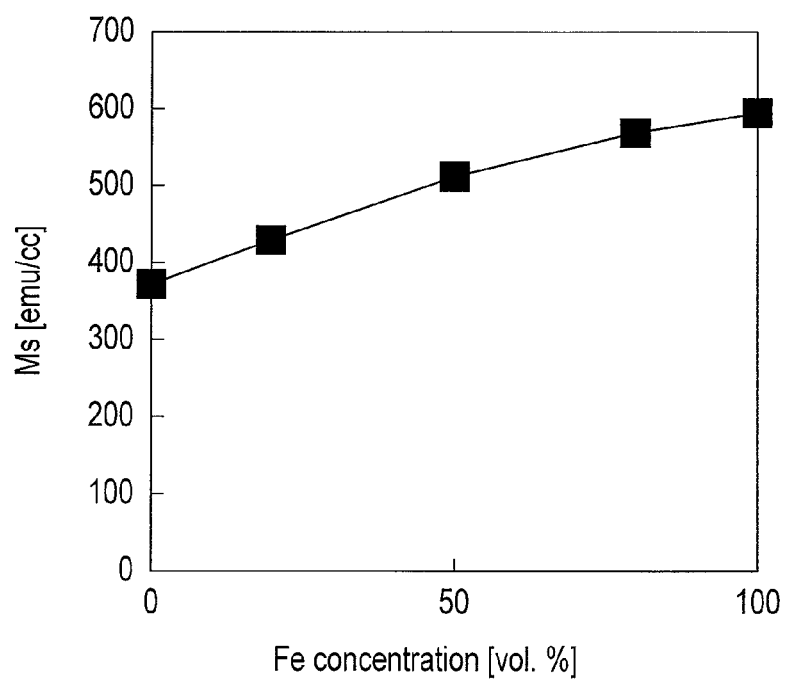
F I G. 9

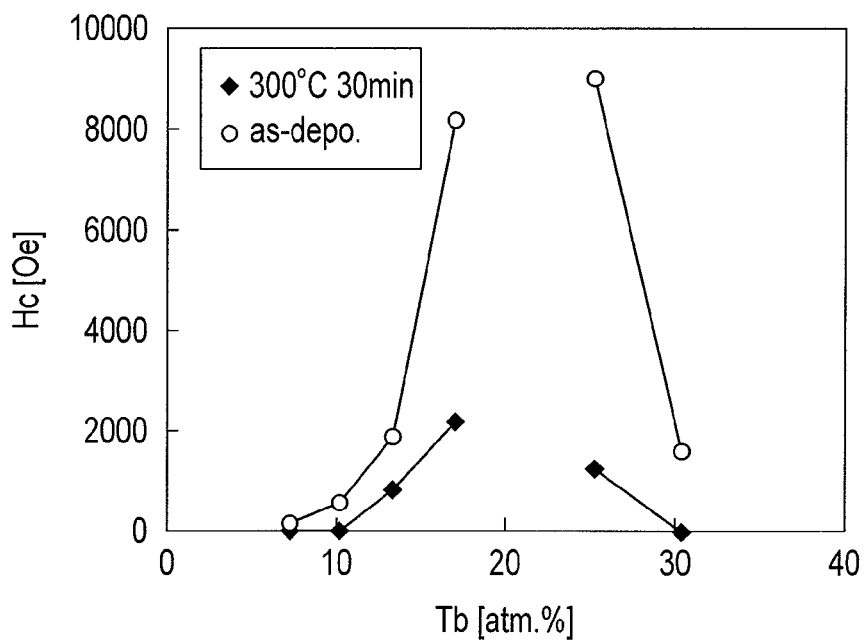
F I G. 10
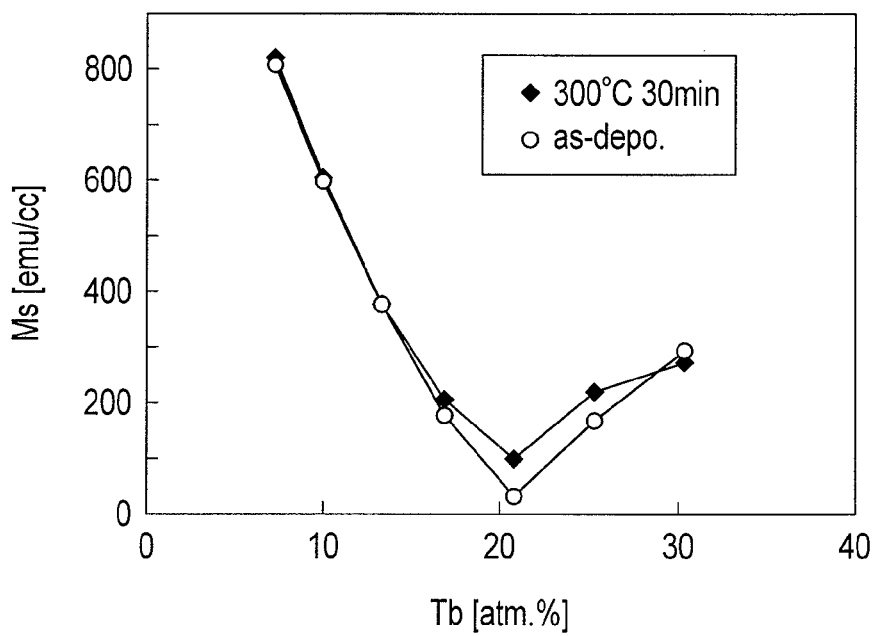
F I G. 11

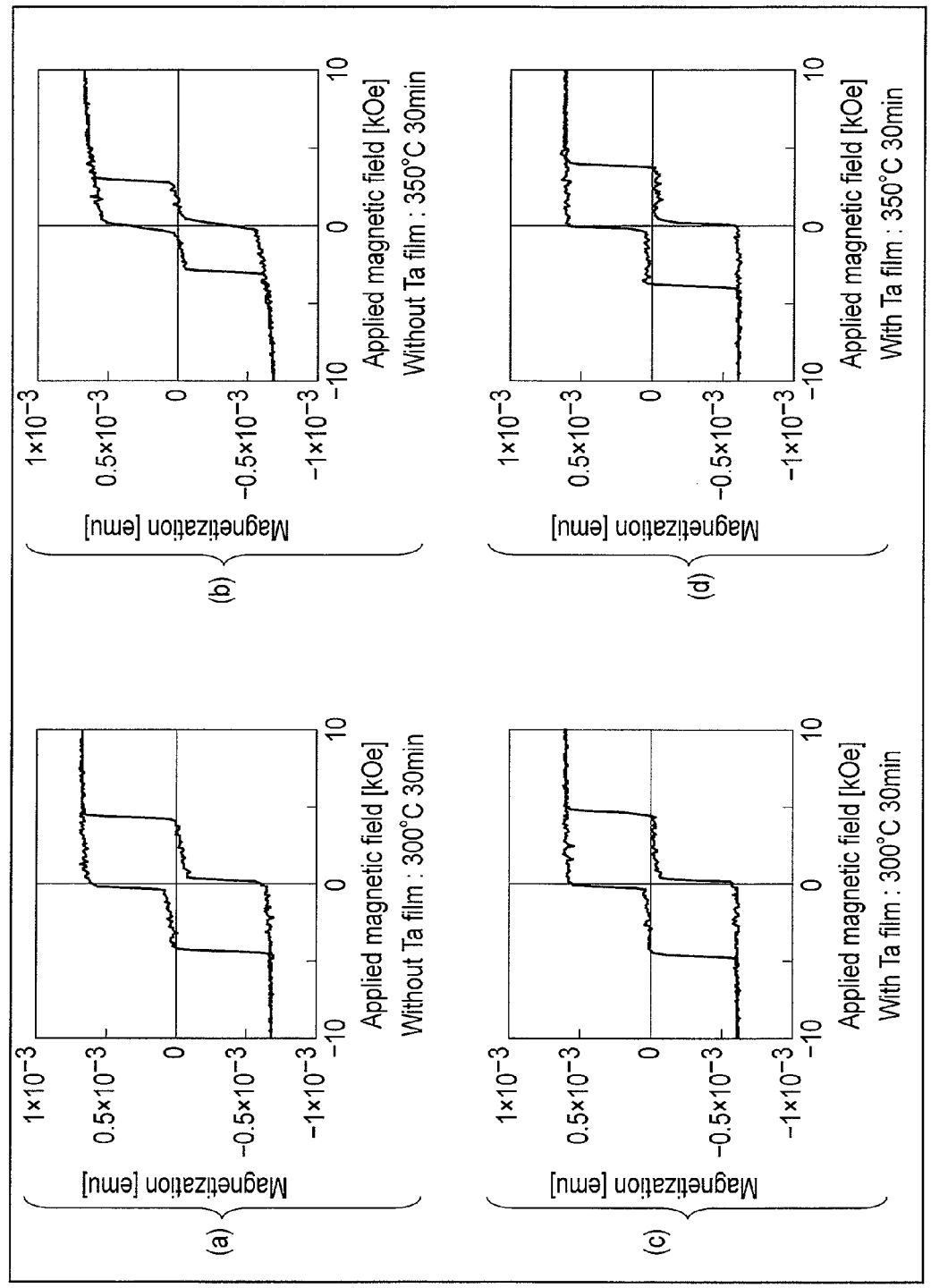
F I G. 14

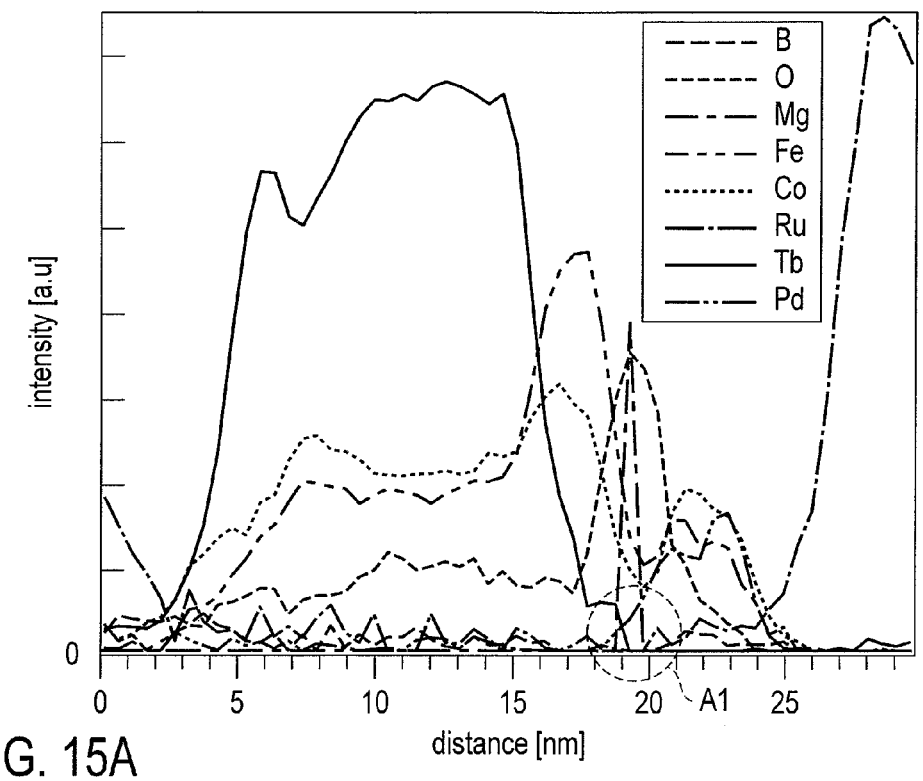
F I G. 15A
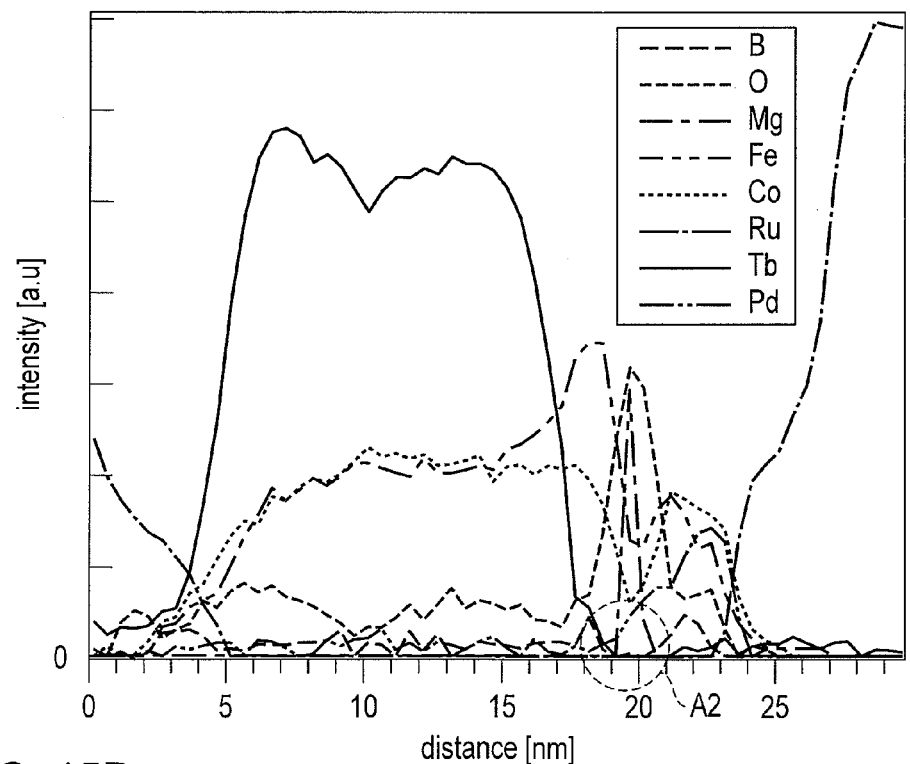
F I G. 15B

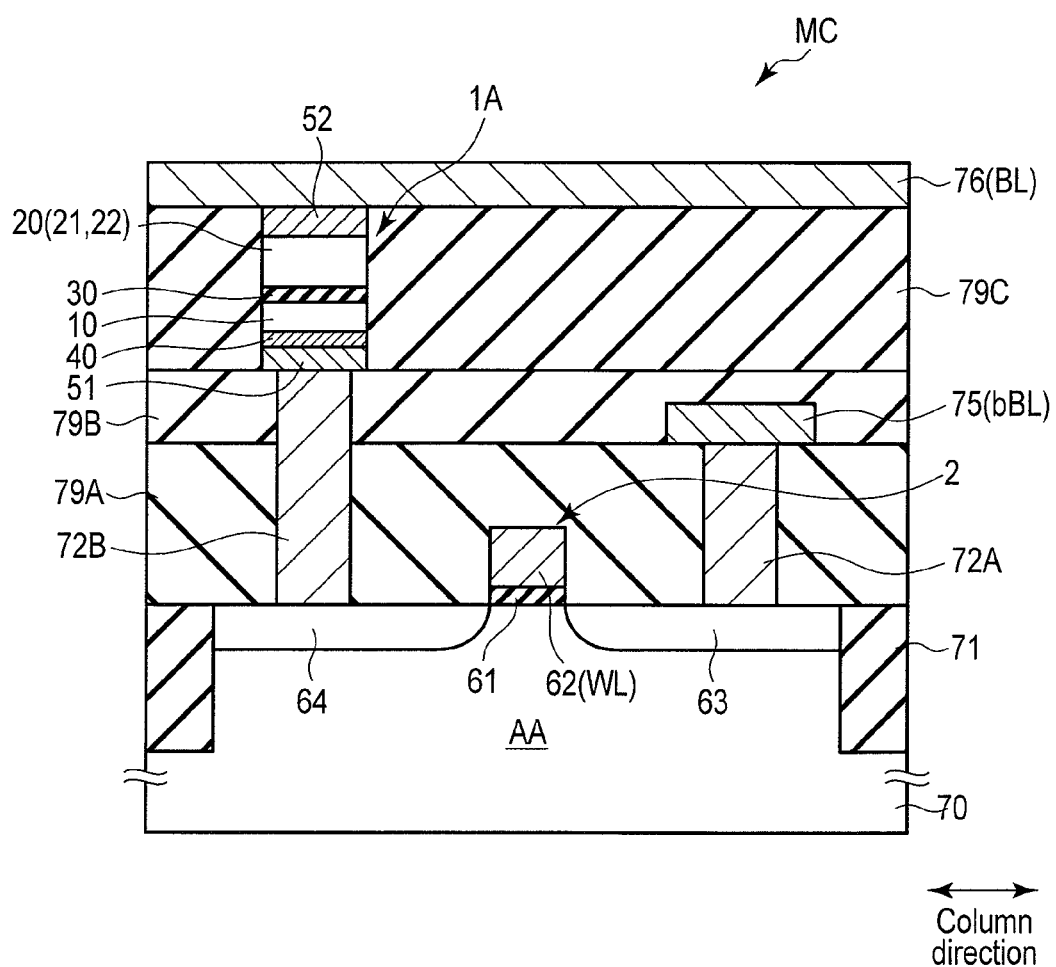
F I G. 22

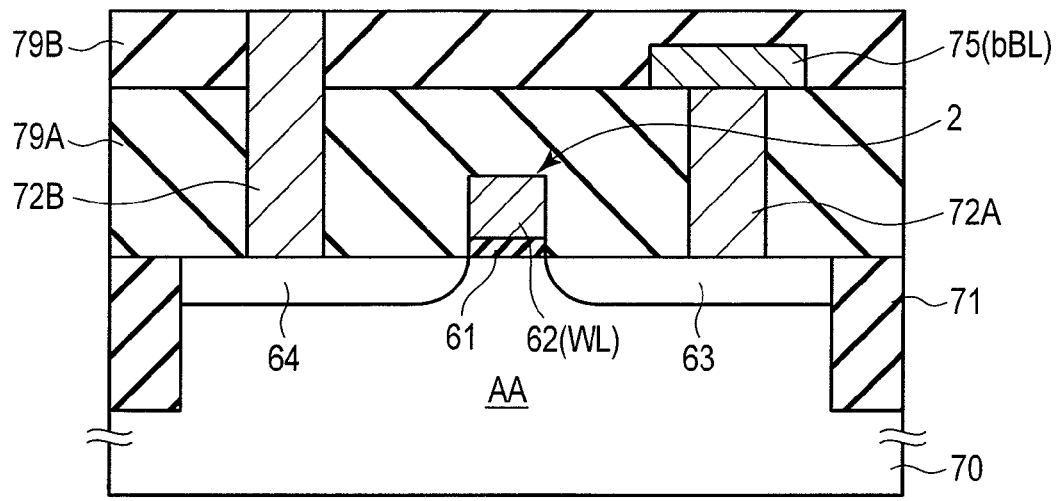
F I G. 23
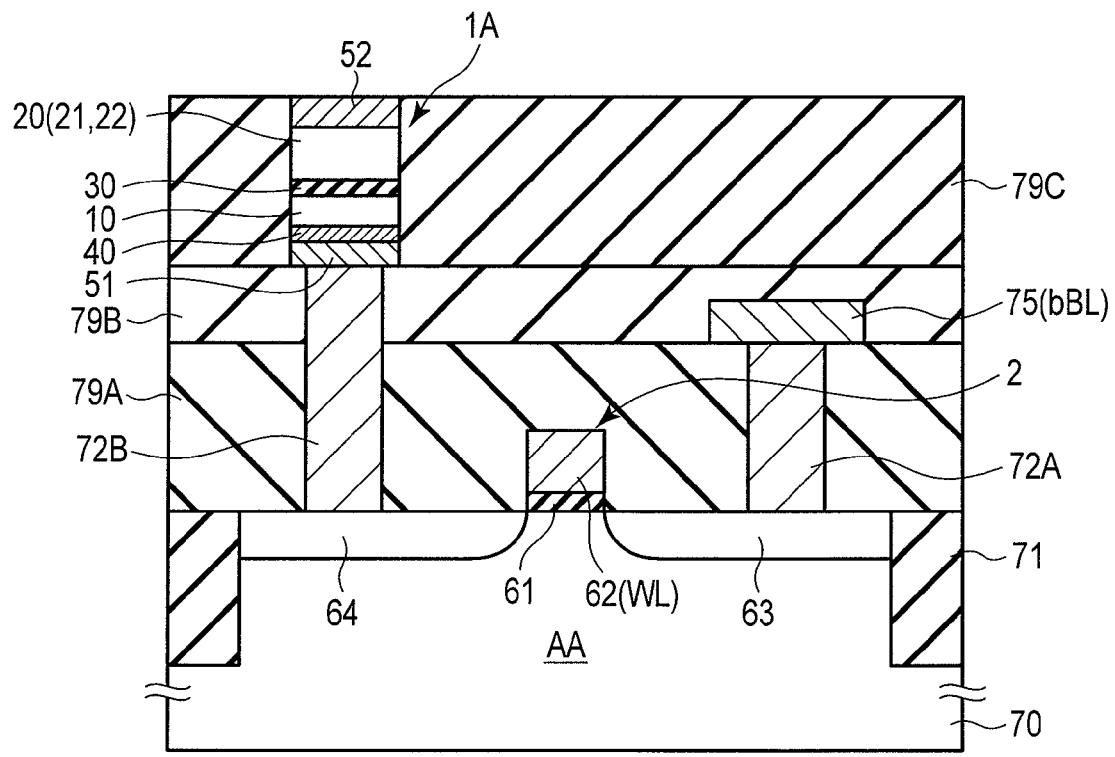
F I G. 24

MAGNETORESISTIVE EFFECT ELEMENT, MAGNETIC MEMORY

CROSS-REFERENCE TO RELATED APPLICATIONS

This application is based upon and claims the benefit of priority from prior Japanese Patent Application No. 2010-210180, filed Sep. 17, 2010, the entire contents of which are incorporated herein by reference.

FIELD

Embodiments described herein relate generally to a magnetoresistive effect element, a magnetic memory, and a method of manufacturing magnetoresistive effect element.

BACKGROUND

In a spin-transfer-torque MRAM, a magnetoresistive effect element using a perpendicular magnetic film is effective for reducing a write current and increasing the capacity of the memory.

In the magnetoresistive effect element used in the spin-transfer-torque MRAM, a material of a perpendicular magnetic film used in a reference layer is preferably a material which can be designed to reduce saturation magnetization of a reference layer in view of shift adjustment of the switching field of the storage layer.

For example, in an amorphous TbCoFe film, the saturation magnetization of the magnetic film can be changed by adjusting a composition ratio between Tb and CoFe. Therefore, the amorphous TbCoFe film is a promising material as a reference layer of a perpendicular magnetic film.

However, the amorphous TbCoFe film has a low level of heat resistance in perpendicular magnetic anisotropy. For this reason, heat treatment for crystallizing a member of a magnetoresistive effect element (such as a tunnel barrier layer) cannot be executed with a sufficient amount of heat (heating temperature). Therefore, it used to be difficult to improve element characteristics of the magnetoresistive effect element using the amorphous TbCoFe film.

BRIEF DESCRIPTION OF THE DRAWINGS

FIG. 4 is a figure of a step for explaining a method for manufacturing the magnetoresistive effect element according to the embodiment;

FIG. 5 is a graph illustrating magnetic characteristics of the magnetoresistive effect element according to the embodiment;

FIG. 6A is a figure illustrating a cross-sectional structure of a magnetic layer of the magnetoresistive effect element;

FIG. 6B is a figure illustrating a cross-sectional structure of the magnetic layer of the magnetoresistive effect element;

FIG. 7 is a figure illustrating a planar structure of a magnetic layer of the magnetoresistive effect element;

FIG. 8 is a graph illustrating relationship between magnetic characteristics of the magnetic layer and an element concentration in the magnetic layer;

FIG. 9 is a graph illustrating relationship between magnetic characteristics of the magnetic layer and an element concentration in the magnetic layer;

FIG. 10 is a graph illustrating relationship between magnetic characteristics of the magnetic layer and an element concentration in the magnetic layer;

FIG. 11 is a graph illustrating relationship between magnetic characteristics of the magnetic layer and an element concentration in the magnetic layer;

FIG. 14 is a figure illustrating magnetic characteristics of the magnetic layer;

FIG. 15A is a graph illustrating an analysis result of EELS;
FIG. 15B is a graph illustrating an analysis result of EELS.

FIG. 22 is a cross-sectional view illustrating a structure of a memory cell of the MRAM to which the embodiment is applied;

FIG. 23 is a cross-sectional view illustrating a step of a method for manufacturing the memory cell of the MRAM to which the embodiment is applied; and FIG. 24 is a cross-sectional view illustrating a step of the method for manufacturing the memory cell of the MRAM to which the embodiment is applied.

DETAILED DESCRIPTION

Hereinafter, a magnetoresistive effect element according to each embodiment will be described in detail with reference to the drawings. In the following description, constituent elements having the same functions and/or configurations are denoted with the same reference numbers, and repeated explanation thereabout will be made as necessary.

In general, according to one embodiment, a magnetoresistive effect element includes a first magnetic layer including perpendicular anisotropy to a film surface and an invariable magnetization direction, the first magnetic layer having a magnetic film including an element selected from a first group including Tb, Gd, and Dy and an element selected from a second group including Co and Fe; a second magnetic layer including perpendicular magnetic anisotropy to the film surface and a variable magnetization direction; and a nonmagnetic layer between the first magnetic layer and the second magnetic layer. The magnetic film includes amorphous phases and crystals whose particle sizes are 0.5 nm or more.

Embodiment

(1) Basic Example

Figure 1:
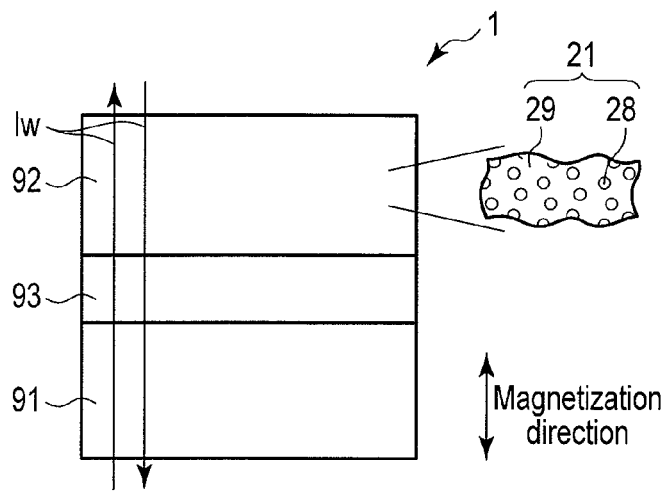
FIG. 1 is a cross-sectional view illustrating a basic structure of a magnetoresistive effect element according to an embodiment.

A basic configuration of a magnetoresistive effect element according to the present embodiment will be explained with reference to FIG. 1.

The magnetoresistive effect element according to the present embodiment includes magnetic layers 91, 92 and a nonmagnetic layer 93 provided between the two magnetic layers 91, 92.

The two magnetic layers 91, 92 are perpendicular magnetic films (magnetization film), and the magnetization of the magnetic layers 91, 92 is in a direction perpendicular to the film surface.

The magnetization direction of one of the two magnetic layers 91, 92, i.e., the magnetic layer 92, is invariable (fixed), and the magnetization direction of the other of the two magnetic layers 91, 92, i.e., the magnetic layer 91, is variable.

When the magnetization direction of a magnetic layer is changed, a current Iw greater than or equal to a magnetization reversal threshold value is passed through the magnetoresistive effect element 1. The magnetization direction of the magnetic layer 91 whose magnetization is variable is changed by spin transfer torque. In other words, when spin-polarized electrons act on the magnetization (spin) of the magnetic layer 91, the magnetization direction of the magnetic layer 91 is changed. The current Iw including the spin polarized electron flow in both directions in the magnetoresistive effect element 1 in accordance with the direction in which the magnetization direction is changed.

A part of at least one of the two magnetic layers 91, 92 (in this case, the magnetic layer 92) has a magnetic film 21 including at least one element selected from a group (first group) including terbium (Tb), gadolinium (Gd), and dysprosium (Dy) and at least one element selected from a group (second group) including cobalt (Co) and iron (Fe). The magnetic film 21 includes amorphous 29 and crystal 28. The plurality of crystals 28 in the magnetic film 21 are, for example, crystals (which may also be referred to as microcrystals) having a particle size (diameter, maximum dimension) of 5 Å (0.5 nm) or more.

For example, the magnetic film 21 in the magnetic layer 92 is a TbCoFe film 21. The TbCoFe film 21 serving as the magnetic film 21 includes amorphous phases 29 including at least one of elements of Tb, Co, and Fe and crystals (crystal particles or crystal phase) 28 including at least one of elements of Co and Fe. For example, the crystals 28 in the TbCoFe film 21 has at least one of crystal structures having a lattice spacing (first lattice spacing) of 1.2 to 1.6 Å (0.12 to 0.16 nm) and a lattice spacing (second lattice spacing) of 1.9 to 2.3 Å (0.19 to 0.23 nm) in a film cross-sectional direction.

It should be noted that both of the magnetic layers 91, 92 in the magnetoresistive effect element 1 may have the magnetic film 21 including the amorphous phases 29 and the crystals 28.

As described above, the magnetic film 21 in the magnetic layer 92 includes the crystals 28 and the amorphous phases 29, and this can prevent deterioration of the magnetic characteristics of the magnetic film (such as TbCoFe film) 21 due to the heat treatment performed at a high temperature (such as 300° C. or more). Therefore, according to the magnetoresistive effect element according to the present embodiment, the heat resistivity of the element can be improved, and crystallization of the constituent member of the element can be accelerated by heat treatment with a sufficient amount of heat.

Therefore, in the magnetoresistive effect element according to the present embodiment, element characteristics can be improved.

(2) First Embodiment

A magnetoresistive effect element according to the first embodiment will be explained with reference to FIGS. 2 to 17.

(a) Structure

A structure of the magnetoresistive effect element according to the first embodiment will be explained with reference to FIG. 2.

The magnetoresistive effect element 1A according to the present embodiment is a magnetic tunnel junction (MTJ) element 1A.

The MTJ element 1A according to the present embodiment includes a lower electrode 51, an underlayer (foundation layer) 40, a first magnetic layer 10, a nonmagnetic layer 30, a second magnetic layer 20, and an upper electrode 52.

In the MTJ element 1A according to the present embodiment, the first and second magnetic layers 10, 20 have large perpendicular magnetic anisotropy to the film surface, and the magnetization directions of the first and second magnetic layers 10, 20 are perpendicular to the film surface. In other words, the first and second magnetic layers 10, 20 are perpendicular magnetic films.

The magnetization direction of the first magnetic layer 10 is variable. The magnetization direction of the second magnetic layer 20 is invariable. In the present embodiment, the magnetic layer whose magnetization direction is variable is referred to as a recording layer (a magnetization free layer, a free layer, storage layer), and the magnetic layer whose magnetization direction is invariable is referred to as a reference layer (which may also be referred to as a magnetization invariable layer, a fixing layer).

The magnetization direction of the recording layer 10 is changed by spin torque transfer (supply of a current greater than or equal to a reversal threshold value). In other words, when spin polarized electrons act on the magnetization (spin) of the recording layer 10, the magnetization direction of the recording layer 10 is changed.

In this case, "the magnetization direction of the reference layer 20 is invariable" or "the magnetization direction of the reference layer 20 is fixed" means that the magnetization direction of the reference layer 20 is not changed when a magnetization reversal current (reversal threshold value) used to reverse the magnetization direction of the recording layer 10 is passed through the reference layer 20. Therefore, in the MTJ element 1, the magnetic layer having a large reversal threshold value is used as the reference layer 20, and the magnetic layer having a reversal threshold value less than the reversal threshold value of the reference layer 20 is used as the recording layer 10. In this manner the MTJ element 1 is formed that includes recording layer 10 whose magnetization direction is variable and the reference layer 20 whose magnetization direction is invariable.

The MTJ element according to the present embodiment uses, for example, the spin-transfer-torque magnetization reversal method to reverse the relative magnetization direction between the recording layer 10 and the reference layer 20.

When the magnetization direction of the recording layer 10 is caused to be in parallel to the magnetization direction of the reference layer 20, i.e., when the magnetization direction of the recording layer 10 is caused to be the same as the magnetization direction of the reference layer 20, a current flowing from the recording layer 10 to the reference layer 20 is supplied to the MTJ element 1A. In this case, electrons move from the reference layer 20 to the recording layer 10 via the tunnel barrier layer 30. Majority electrons (spin polarized electrons) passing through the reference layer 20 and the tunnel barrier layer 30 have the same direction as the direction of the magnetization (spin) of the reference layer 20. The spin angular momentum (spin torque) of the spin polarized electrons is applied to the magnetization of the recording layer 10, whereby the magnetization direction of the recording layer 10 is reversed. In this parallel arrangement, the resistance of the MTJ element 1 becomes the smallest.

When the magnetization direction of the recording layer 10 is caused to be in antiparallel to the magnetization direction of the reference layer 20, i.e., when the magnetization direction of the recording layer 10 is caused to be opposite to the magnetization direction of the reference layer 20, a current flowing from the reference layer 20 to the recording layer 10 is supplied to the MTJ element 1A. In this case, electrons move from the recording layer 10 to the reference layer 20. Electrons having spin antiparallel to the magnetization direction of the reference layer 20 are reflected by the reference layer 20. The reflected electrons are injected into the recording layer 10 as spin polarized electrons. The spin angular momentum of the spin polarized electrons (reflected electrons) is applied to the magnetization of the recording layer 10, and the magnetization direction of the recording layer 10 becomes opposite to the magnetization direction of the reference layer 20 (antiparallel arrangement). In this antiparallel arrangement, the resistance of the MTJ element 1 becomes the largest.

Figure 2:
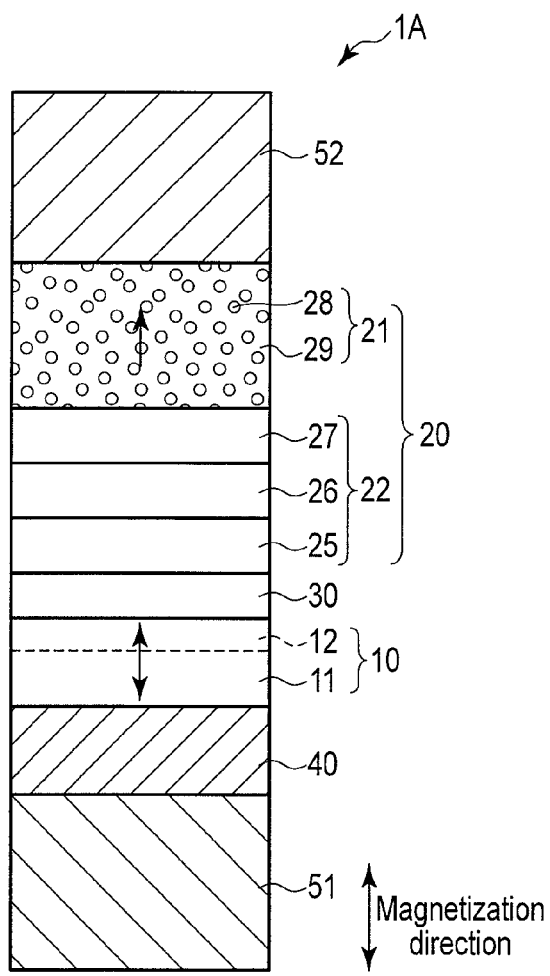
FIG. 2 is a cross-sectional view illustrating a structure of a magnetoresistive effect element according to the first embodiment.

The MTJ element 1A as shown in FIG. 2 is a top pin-type MTJ element in which the reference layer 20 is stacked (layered) above the recording layer 10 with the nonmagnetic layer 30 interposed therebetween.

In the explanation below, the recording layer 10 and the reference layer 20 have a multi-layer structure in the MTJ element 1A according to the present embodiment. In the explanation below, a multi-layer structure (or stacked structure) of a member A and a member B is denoted as "A/B". This means that the left side of "/", i.e., the member "A", is stacked on the right side of "/", i.e., the member "B".

The lower electrode 51 is provided on a substrate (not shown).

The lower electrode 51 has a multi-layer structure including Ta/Cu/Ta.

The tantalum (Ta) film in the lowermost layer of the lower electrode 51 has a film thickness of 150 Å (15 nm). The Ta film in the uppermost layer of the lower electrode 51 has a film thickness of 200 Å (20 nm). The copper (Cu) film sandwiched between the two Ta films has a film thickness of 350 Å (35 nm).

The underlayer 40 has an atom close-packed plane. Accordingly, the recording layer 10 having the large perpendicular magnetic anisotropy is formed. For example, the underlayer 40 has a multi-layer structure including Pd/Ir/Ru. The film thickness of the ruthenium (Ru) film in the lowermost layer is 50 Å (5 nm). The film thickness of the iridium (Ir) film is 50 Å (5 nm). The film thickness of the palladium (Pd) film is 2 Å (0.2 nm). The crystals in the Ru film is orianted in, e.g., the hcp (0001) plane (c-axis direction), in order to control the crystal oriantations of the Ir film and the Pd film. The Ir film and the Pd film have an effect on the recording layer 10 to improve the perpendicular magnetic anisotropy of the recording layer. When the film thicknesses of the Ir film and the Pd film are adjusted, the magnitude of the perpendicular magnetic anisotropy energy of the recording layer 10 can be changed. It should be noted that the Pd film of the underlayer 40 may be deemed as a part of the recording layer 10.

The recording layer 10 is provided on the underlayer 40. The recording layer 10 has a multi-layer structure including CoFeB/Ta/CoB/Co. The cobalt (Co) film in the lowermost layer is in contact with the upper surface of the Pd film of the underlayer 40. The Co film 11 is a perpendicular magnetic film (perpendicular magnetization film). The film thickness of the Co film 11 is, for example, 5 Å (0.5 nm). The cobalt-boron (CoB) film is provided on the Co film 11. The film thickness of the CoB film is, for example, 4 Å (0.4 nm). A tantalum (Ta) film is provided on the CoB film. For example, the Ta film has a film thickness of 3 Å (0.3 nm). The cobalt-steel-boron (CoFeB) film is provided on the Ta film. The film thickness of the CoFeB film is, for example, 8 Å (0.8 nm).

A portion 12 between the perpendicular magnetic film (in this case, Co film) 11 in the recording layer 10 and the nonmagnetic layer 30, as seen in the multi-layer structure including CoFeB/Ta/CoB, may be referred to as an interface layer. It should be noted that, instead of the CoB film disposed between the Ta film and the Co film, a CoFeB film may be used. Alternatively, instead of CoFeB in the uppermost layer, an FeB film may be used. Instead of the Ta film in the interface layer 12, a tungsten (W) film, a niobium (Nb) film, or a molybdenum (Mo) film may be used.

The CoFeB film formed on the Ta film is provided to increase a difference of resistance (or MR ratio) between a case where the relationship between the magnetization direction of the recording layer 10 and the magnetization direction of the reference layer 20 is in parallel and a case where the relationship between the magnetization direction of the recording layer 10 and the magnetization direction of the reference layer 20 is in antiparallel. However, when the thickness of the CoFeB film is increased, the perpendicular magnetic anisotropy of the recording layer 10 is deteriorated. Therefore, the film thickness is preferably adjusted to an appropriate size. For example, the film thickness of the CoFeB film on the Ta film is preferably within a range of 7 to 12 Å (0.7 to 1.2 nm).

Further, Ta film prevents Pd atoms from diffusing into the nonmagnetic layer 30. As a result, the MR ratio of the MTJ element improves. However, when the thickness of the Ta film increases, the Ta atoms diffuse into the nonmagnetic layer 30, which reduces the MR ratio. Therefore, the film thickness of the Ta film is preferably less than or equal to 5 Å (0.5 nm).

The CoB film (or the CoFeB film) and the Co film formed below the Ta film contribute to the magnitude of the perpendicular magnetic anisotropy of the recording layer 10. However, when the film thicknesses of the CoB film (or the CoFeB film) and the Co film are increased, the magnetization reversal current (magnetization reversal threshold value) due to the spin transfer torque with respect to the recording layer 10 increases. Therefore, the film thicknesses of the CoB film (or the CoFeB film) and the Co film are preferably less than or equal to 10 Å (1.0 nm).

Naturally, it is to be understood that the CoFeB/Ta/CoB layers have the perpendicular magnetic anisotropy.

For example, the nonmagnetic layer 30 is a magnesium oxide (MgO) film. The nonmagnetic layer 30 using an insulating film such as a MgO film is referred to as a tunnel barrier layer. In the explanation below, the nonmagnetic layer is referred to as a tunnel barrier layer 30. The MgO film serving as the tunnel barrier layer 30 has a film thickness of 10 Å (1 nm).

For example, calcium oxide (CaO), strontium oxide (SrO), titanium oxide (TiO), vanadium oxide (VO), and niobium oxide (NbO) may be used as the nonmagnetic layer. The above oxides including MgO have a crystal structure of sodium chloride (NaCl) structure.

When these oxides having the NaCl structure are used as the nonmagnetic layer (tunnel barrier layer), the oxides are preferably oriented in the (001) plane (or orientation) and planes equivalent thereto (or orientation).

The reference layer 20 is provided on the tunnel barrier layer 30. In the present embodiment, the reference layer 20 has a multi-layer structure including at least TbCoFe/CoFeB/Ta/CoFeB.

The CoFeB film 25 in the lowermost layer of the reference layer 20 is in contact with the tunnel barrier layer (MgO film) 30. The film thickness of the CoFeB film 25 in the lowermost layer is about 15 Å (1.5 nm). The Ta film 26 is sandwiched by the two CoFeB films 25, 27. The film thickness of the Ta film 26 is about 3 Å (0.3 nm). The CoFeB film 27 on the Ta film 26 has a film thickness of 4 Å (0.4 nm).

The TbCoFe film 21 of the uppermost layer of the reference layer 20 has, for example, a film thickness of 120 Å (12 nm). The TbCoFe film 21 is a perpendicular magnetic film. The composition ratio of Tb in the TbCoFe film is, for example, 13 atomic %. However, the composition ratio of Tb in the TbCoFe film is not limited to this value. The composition ratio of Tb in the TbCoFe film is preferably greater than or equal to 10 atomic %. When the composition ratio of Tb in the TbCoFe film is set at a value greater than or equal to 20 atomic %, the magnetization direction of the perpendicular magnetic film 21 and the magnetization direction of the interface layer 22 can be arranged in antiparallel. Accordingly, a magnetostatic stray field applied from the reference layer 20 to the recording layer 10 can be reduced. The magnetostatic stray field applied from the reference layer 20 to the recording layer 10 changes the magnetization reversal magnetic field of the recording layer 10, which reduces the thermal stability (heat resistance) of the recording layer 10. For this reason, the magnetostatic stray field applied to the recording layer is preferably zero.

The magnetostatic stray field applied from the reference layer 20 to the recording layer 10 is reduced to zero by inserting a perpendicular magnetic film (bias layer) between the upper electrode 52 and the reference layer 20 or between the underlayer 40 and the lower electrode 51, wherein the magnetization of the perpendicular magnetic film (bias layer) is in antiparallel with the magnetization direction of the reference layer 20.

When the composition ratio of Tb in the TbCoFe film is set at a value greater than or equal to 20 atomic %, it is not necessary to insert the bias layer in order to reduce the magnetostatic stray field applied from the reference layer 20 to the recording layer 10 to zero. Accordingly, the MTJ element can be made as a thin film, and the dimension of the MTJ element in the stacking direction of the film can be reduced.

Like the recording layer 10, the reference layer 20 includes an interface layer 22 in proximity to an interface between the perpendicular magnetic film (first magnetic film or first magnetization film) 21 and the tunnel barrier layer 30. In the reference layer 20, the CoFeB/Ta/CoFeB films 25, 26, 27 correspond to the interface layer 22 of the reference layer 20. The interface layer (second magnetic film or second magnetization film) 22 also includes magnetic anisotropy perpendicular to the film surface.

In the present embodiment, the Ta film (or the W film, the Nb film, the Mo film) 26 in the interface layer 22 is referred to as an intermediate film or an insertion film.

When the interface layers in the reference layer 20 and the recording layer 10 are alloy films including at least two of Co, Fe, and B, a film different from the CoFeB film may be used as a constituent element of the interface layer.

The upper electrode 52 is provided on the reference layer 20. The upper electrode 52 has a stacked structure including Ru/Ta. The Ta film in the lower layer of the upper electrode 52 has a film thickness of about 50 Å (5 nm). The Ta film is in contact with the TbCoFe film 21 of the reference layer 20. The Ru film is stacked on the Ta film. The film thickness of the Ru film is 200 Å (20 nm).

It is to be understood that in each film of the magnetoresistive effect element according to the present embodiment (MTJ element), a very small amount of element constituting films adjacent to each other may be included, or a thin compound layer of an element constituting two films adjacent to each other may be formed in the interface between the two films.

In the magnetoresistive effect element 1A according to the first embodiment, the reference layer (second magnetic layer) 20 includes the TbCoFe film 21.

TbCoFe film 21 includes amorphous phases 29 including at least one of elements of Tb, Co, and Fe and crystals (crystal particles or crystal phase) 28 including at least one of elements of Co and Fe. For example, the crystals 28 in the TbCoFe film 21 are crystals having particle sizes of 5 Å (0.5 nm) or more. In the explanation below, a crystal particle/crystal phase having a particle size of 30 Å (3 nm) or less or preferably 10 Å (1 nm) or less is referred to as a microcrystal. For example, the particle size of a microcrystal is defined as an average particle size of a plurality of microcrystals included in the magnetic layer.

For example, the microcrystal in the TbCoFe film 21 has at least one of a crystal structure having a lattice spacing of 1.2 to 1.6 Å (0.12 to 0.16 nm) and a lattice spacing of 1.9 to 2.3 Å (0.19 to 0.23 nm) in a film cross-sectional direction. The TbCoFe film 21 includes at least one of a microcrystal (nanocrystal) having a lattice spacing of 1.2 to 1.6 Å (0.12 to 0.16 nm) and a microcrystal having a lattice spacing of 1.9 to 2.3 Å (0.19 to 0.23 nm).

Further, gadolinium (Gd) and dysprosium (Dy) may be further added to the TbCoFe film 21. Instead of Tb of the TbCoFe film 21, Gd and Dy may be used. Even when Gd and Dy are used in the perpendicular magnetic film 21 of the reference layer 20, the perpendicular magnetic film 21 includes the amorphous phases 29 and the crystals 28. Instead of Co or Fe, nickel (Ni) and manganese (Mn) may be used in the perpendicular magnetic film 21 including the amorphous phases 29 and the crystals 28.

Since the perpendicular magnetic film (in this case, TbCoFe film) 21 in the reference layer 20 includes the amorphous phases 29 and the crystals 28, the entire TbCoFe film 21 is not crystallized even when heat of 300° C. or more is applied to the reference layer 20. In other words, even when high temperature heat treatment (of 300° C. or more) is applied to the TbCoFe film 21 including the amorphous phases 29 and the crystals 28, the amorphous phases 29 is prevented from being crystallized by the crystals 28 oriented randomly. Therefore, this prevents deterioration of the magnetic characteristics of the TbCoFe film 21 due to heat.

Therefore, in the magnetoresistive effect element according to the present embodiment, the heat resistance is improved, and for example, sufficient amount of heat can be given to the constituent members of the magnetoresistive effect element during the heat treatment for crystallization.

Therefore, according to the magnetoresistive effect element according to the present embodiment, the element characteristics of the magnetoresistive effect element can be improved.

(b) Manufacturing Method

Figure 3:
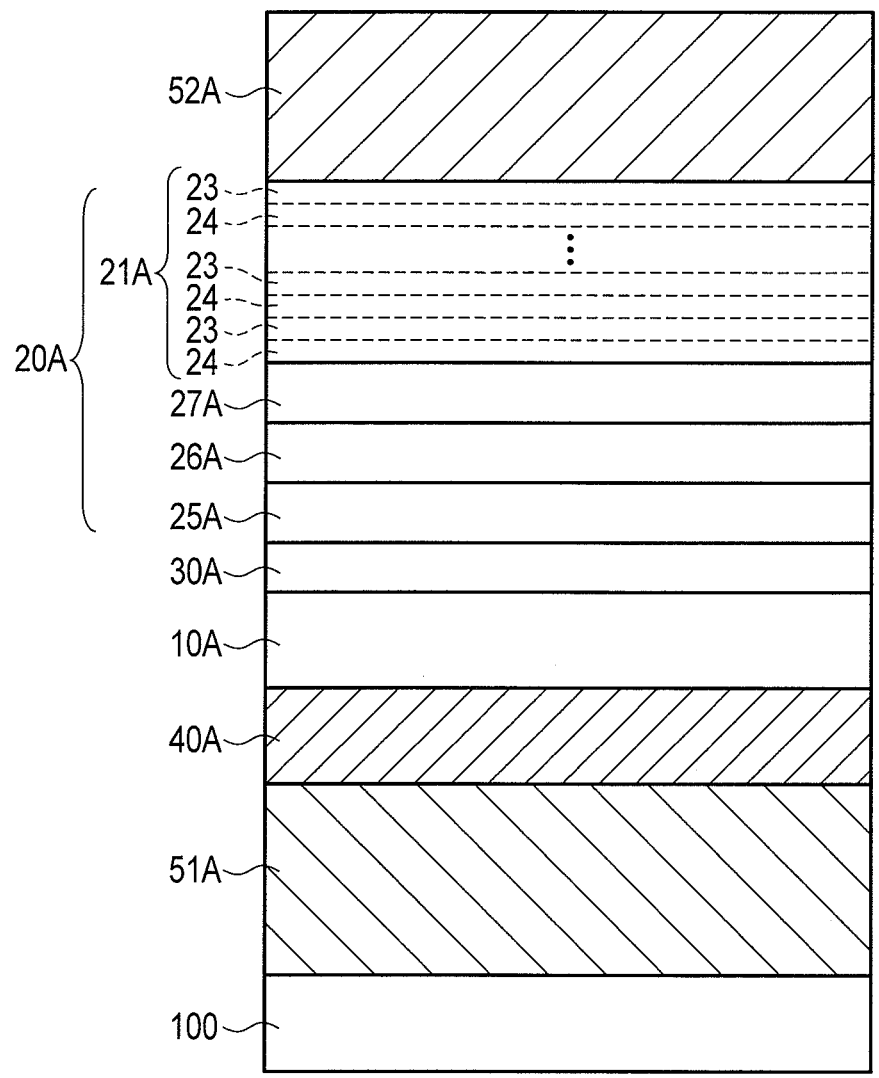
FIG. 3 is a figure of a step for explaining a method for manufacturing a magnetoresistive effect element according to the embodiment.

A method for manufacturing the magnetoresistive effect element according to the present embodiment will be explained with reference to FIGS. 3 and 4. FIGS. 3 and 4 are cross-sectional views illustrating steps of the method for manufacturing the magnetoresistive effect element. Although a structure of the magnetoresistive effect element (MTJ element) as shown in FIG. 2 is shown as an example in this case, the structure is not limited thereto. It is to be understood that the combination of materials and the composition of materials used in the element can be changed as necessary.

As shown in FIG. 3, an electrode layer 51A for forming a lower electrode is formed on a substrate 100 using the sputtering method, for example. The electrode layer 51A has a multi-layer structure including Ta/Cu/Ta.

For example, an underlayer 40A is deposited on the electrode layer 51A using the sputtering method, for example.

The underlayer 40A has an atom close-packed plane. For example, the underlayer 40A has a multi-layer structure including Pd/Ir/Ru.

A magnetic layer 10A serving as a storage layer is deposited on the underlayer 40A using the sputtering method, for example. The magnetic layer 10A has a multi-layer structure including CoFeB/Ta/CoB/Co, for example. When the magnetic layer 10A is deposited on the underlayer 40A having an atom close-packed plane, the magnetic layer 10A having the perpendicular magnetic anisotropy is formed.

A nonmagnetic layer (tunnel barrier layer) 30A is deposited on the magnetic layer 10A. The nonmagnetic layer 30A is, for example an MgO film.

A magnetic layer 20A for forming a reference layer is deposited on the nonmagnetic layer 30A. The magnetic layer 20A has a multi-layer structure. Layers 25A, 26A, 27A serving as interface layers for the reference layer are deposited on the nonmagnetic layer 30A. For example, the interface layer is formed by inserting a Ta film during the deposition of the CoFeB film. In other words, the CoFeB film 25A is deposited on the nonmagnetic layer 30A. The Ta film 26A is deposited on the CoFeB film 25A. The CoFeB film 27A is deposited on the Ta film 26A. As a result, the interface layers 25A, 26A, 27A having the multi-layer structure including CoFeB/Ta/CoFeB are formed on the nonmagnetic layer 30A.

The multi-layer film 21A is deposited on the CoFeB film 27A. The multi-layer film 21A has a structure made by alternately stacking a first film 23 and a second film 24. The first film 23 is stacked on the second film 24.

When the magnetic layer formed on the interface layer (CoFeB film) 27A is a TbCoFe film, a CoFe film is used as the first film 23, and a TbCo film is used as the second film 24, for example. In this case, the first film 23 is referred to as a CoFe film 23, and the second film 24 is referred to as a TbCo film 24. The CoFe film 23 is deposited on the TbCo film 24. The structure made by stacking the CoFe film 23 on the TbCo film 24 is also referred to as a CoFe/TbCo film. The CoFe film 23 is deposited to have a film thickness of about 3 Å (0.3 nm), for example. The TbCo film 24 is deposited to have a film thickness of about 3 Å (0.3 nm), for example.

When the pair of CoFe/TbCo films 23, 24 are adopted as one cycle, for example, 20 cycles of CoFe/TbCo films 23, 24 are stacked on the interface layer 27A (above the nonmagnetic layer 30A). It is to be understood that the number of cycles (the number of stacks) of the CoFe/TbCo film in the multi-layer film 21A varies according to the film thickness of the formed magnetic layer (in this case, the TbCoFe film).

The combination of the first and second films 23, 24 in the multi-layer film 21A can be changed as necessary according to the main components and composition in the formed magnetic layer. When the formed reference layer is the TbCoFe film, not only the stacked film including the TbCo film and the CoFe film but also, for example, a stacked film including a TbFe film and a CoFe film, a stacked film including a TbCo film and an Fe film, a stacked film including a TbCo film and a Co film, a stacked film including a TbFe film and a Co film, a stacked film including a TbFe film and an Fe film, a stacked film including a TbCoFe film and an Fe film, a stacked film including a TbCoFe film and a Co film, or a stacked film including a TbCoFe film and a CoFe film may be used in the multi-layer film 21A. In this case, two kinds of films 23, 24 having different compositions are used in the multi-layer film 21A, but three kinds of films or more having different compositions may also be used in the multi-layer film 21A.

In order to maintain the perpendicular magnetic anisotropy of the multi-layer film 21A, the composition ratio of Tb in the multi-layer film 21A is preferably greater than or equal to 10 atomic %. When the composition ratio of Tb in the multi-layer film 21A is greater than or equal to 10 atomic % or more, the composition ratio of Tb in the TbCo film serving as the second film 24 is greater than or equal to 25 atomic %. Therefore, the composition ratio of Tb in the TbCo film serving as the second film 24 is preferably greater than or equal to 25 atomic % or more.

Instead of the film including Tb, a film including Dy or Gd may be used in the multi-layer film 21A. For example, a stacked film including a DyCo film and a CoFe film or a stacked film including a GdCo film and a CoFe film are used in the multi-layer film 21A. Alternatively, a film in which a portion of Tb in the film is replaced with Dy or Gd, i.e., a film including both of Tb and Dy or a film including both of Tb and Gd, may be used in the multi-layer film 21A. For example, a stacked film including a TbDyCo film and an Fe film and a stacked film including a TbGdCo film and an Fe film are used.

An electrode layer 52A for forming an upper electrode is formed on the multi-layer film 21A using the sputtering method, for example. The electrode layer 52A has a stacked structure including Ru/Ta.

Accordingly, a stacked layer (stacked material, stacked body) for forming the magnetoresistive effect element (MTJ element) is formed on the substrate. Naturally, it is to be understood that the order of stacks of each layer is different according to the structure of the formed magnetoresistive effect element.

Thereafter, heat treatment is executed on the stacked layer deposited on the substrate 100. For example, the heat treatment is executed for about 30 minutes at a heating temperature of about 300 to 400° C.

When thermal energy is given, interdiffusion of Co, Fe, and Tb occurs in the films (in this case, CoFe/TbCo film) 23, 24 in the multi-layer film 21A on the interface layer 27A. Accordingly, as shown in FIG. 4, the TbCoFe film 21B serving as the perpendicular magnetic film for the reference layer is formed on the interface layer 27A.

The formed TbCoFe film 21B includes the amorphous phases 29 and the crystals (crystal particles or crystal phase) 28. The amorphous phases 29 includes at least one type of elements of Tb, Co, and Fe. The crystal 28 includes at least one type of elements of Co and Fe. The types of elements respectively forming the amorphous phases and the crystals change in accordance with the types of constituent elements of the films 23, 24 in the magnetic film 21B.

It should be noted that, regardless of the heat treatment, diffusion of atoms (migration of atoms) at the interface of the films and temperature rise during deposition may cause precipitation of the crystals 28 into the multi-layer film 21A when the CoFe/TbCo film is deposited.

In the TbCoFe film 21B, the plurality of microcrystals 28 are crystals whose particle sizes are greater than or equal to 0.5 nm. Each microcrystal 28 in the TbCoFe film 21 has at least one of a crystal structure having a lattice spacing of 1.2 to 1.6 Å (0.12 to 0.16 nm) and a lattice spacing of 1.9 to 2.3 Å (0.19 to 0.23 nm) in a film cross-sectional direction.

As described above, the crystals 28 whose crystal structures are different (random) are formed in the magnetic film (in this case, TbCoFe film) 21B, so that the crystals 28 having different crystal structures interfere with each other, which prevents increase of the size of the crystal particles caused by the thermal treatment, and prevents crystallization of the amorphous phases 29 of the magnetic film 21B. Therefore, the entire magnetic film 21B is not crystallized. Further, the magnetic film 21 includes the amorphous phases 29 and the fine crystals 28, and therefore, even if the heat treatment (for example, deposition of inter-layer insulating film) is performed in a step after the MTJ element is formed, crystallization of amorphous phases, decomposition of microcrystals, and recrystallization of microcrystals hardly occur in the perpendicular magnetic film 21B.

Therefore, the TbCoFe film including the amorphous phases 29 and the microcrystals 28 has large perpendicular magnetic anisotropy while the magnetic characteristics are not deteriorated by the heat treatment.

When the film thickness of the CoFe film 23 is increased to 2 nm or more in order to form crystals whose particle sizes are 20 Å (2 nm) or more in the magnetic film 21B, the CoFe film becomes an in-face magnetic film. This causes deterioration of the perpendicular magnetic anisotropy of the reference layer 20 formed using the CoFe film. Therefore, the CoFe film 23 in the multi-layer film is preferably formed such that the CoFe film 23 has a film thickness of 20 Å (2 nm) or less, e.g., 3 to 4 Å (0.3 to 0.4 nm) as described above. On the other hand, since the film thicknesses of the CoFe film 23 and the TbCo film 24 in the multi-layer film depend on the particle sizes of the formed crystals 28, the CoFe film 23 and the TbCo film 24 are preferably formed to have a thickness of 20 Å (2 nm) or less.

This heat treatment accelerates crystallization of the tunnel barrier layer 30A and the first magnetic layer 10A. For example, the orientation of the (001) plane improves in the MgO film serving as the tunnel barrier layer 30A. Further, the interface layer 12 in the first magnetic layer 10A is lattice-matched with the crystallized tunnel barrier layer 30A, and is crystallized. Therefore, the MTJ element with the high MR ratio can be formed.

Thereafter, for example, the films 51A, 40A, 10A, 30A, 20A, 52A on the substrate 100 are patterned by photolithography technique, and are processed using the reactive ion etching (RIE) method or ion milling method. As a result, the magnetoresistive effect element (MTJ element) 1A as shown in FIG. 2 is formed.

It should be noted that the heat treatment may be executed after the magnetoresistive effect element is processed into a predetermined shape.

As described above, with the method for manufacturing the magnetoresistive effect element according to the present embodiment, the magnetoresistive effect element including the perpendicular magnetic film (for example, a TbCoFe film) 21 having high heat resistance can be formed.

Therefore, according to the method for manufacturing the magnetoresistive effect element according to the present embodiment, the magnetoresistive element with high element characteristics can be provided.

(c) Characteristics

The characteristics of the magnetoresistive effect element 1A according to the present embodiment will be explained with reference to FIGS. 5 to 15.

(c-1) Crystal Structure and Characteristics of Perpendicular Magnetic Film

FIG. 5 illustrates a magnetic resistance (MR) ratio of the MTJ element 1A according to the present embodiment.

FIG. 5 illustrates change of the MR ratio when the MTJ element according to the present embodiment is formed by performing heat treatment at 300, 325, and 350° C. for 30 minutes.

As shown in FIG. 5, when the heat treatment is performed at each temperature, the MTJ element according to the present embodiment has an MR ratio of 100% or more.

Further, FIG. 5 indicates that even when the thermal treatment at 350° C. is performed on the MTJ element according to the present embodiment, the MTJ element according to the present embodiment has a high MR ratio (for example, 150% or more) without any deterioration caused by the heating.

FIGS. 6A, 6B, and 7 illustrate observation results of the perpendicular magnetic film of the MTJ element using a transmission electron microscope (TEM). The perpendicular magnetic film is, for example, the TbCoFe film.

The TEM image of FIGS. 6A and 6B illustrates a measurement result of a dark field image.

FIG. 6A illustrates a cross-sectional TEM image (dark field image) of the TbCoFe film according to the present embodiment when an objective aperture of the TEM is set at a diffraction spot corresponding to lattice spacing d=1.9 to 2.3 Å (0.19 to 0.23 nm).

FIG. 6B illustrates a cross-sectional TEM image (dark field image) of the TbCoFe film according to the present embodiment when an objective aperture of the TEM is set at a diffraction spot corresponding to lattice spacing d=1.2 to 1.6 Å (0.12 to 0.16 nm).

FIG. 7 illustrates a diffraction ring in the TEM image in a planar direction of the TbCoFe film according to the present embodiment.

As described above (see FIG. 3), for example, the TbCoFe film (first magnetic film) 21 serving as the perpendicular magnetic film is formed by alternately stacking about 20 cycles of the TbCo film (about 3 Å [0.3 nm]) 24 and the CoFe film (about 3 Å [0.3 nm]) 23 during deposition of the films.

In the setting conditions of the objective apertures as shown in FIGS. 6A and 6B, it is observed that white spots of about 1 nm are distributed at the same degree within the film. Under the above setting conditions, the white spots observed by the TEM correspond to the crystal particles (crystal phase).

This indicates that the TbCoFe film 21 includes the crystals whose lattice spacing (first lattice spacing) corresponds to d=1.2 to 1.6 Å (0.12 to 0.16 nm) and the crystal whose lattice spacing (second lattice spacing) corresponds to d=1.9 to 2.3 Å (0.19 to 0.23 nm).

In view of the position of the diffraction ring in FIG. 7, the crystals included in the TbCoFe film are considered to have a hexagonal close-packed (hcp) lattice structure in which a lattice constant in a direction parallel to the in-face direction of the film is about 2.4 to 2.5 Å (0.24 to 0.25 nm).

In view of the full-width half-maximum (FWHM) of the diffraction ring, an average crystal particle size of the crystals included in the TbCoFe film is considered to be 30 Å (3 nm) in the direction parallel to the in-face direction of the film.

Further, as shown in FIG. 7, halo-like (blurry) diffraction ring is observed. Therefore, in the TEM image under the above setting conditions, portions other than white spots (for example, a gray portion) are considered to be amorphous phases.

These observation results using the TEM indicate that the TbCoFe film 21 used in the magnetoresistive effect element according to the present embodiment is the film including the amorphous phases and the crystals having crystal particle sizes of 0.5 nm or more.

As shown in FIG. 5, even when the heat treatment is performed on the element at 300° C. or more, the MTJ element including the TbCoFe film according to the present embodiment has an MR ratio of 100% or more without any deterioration in characteristics due to heat. That is, even when the TbCoFe film is used as the perpendicular magnetic film, the MTJ element according to the present embodiment has a high degree of resistance to temperature.

As described above, in the present embodiment, the randomly oriented crystals 28 are precipitated into the TbCoFe film that is formed by alternately stacking the films having different compositions (in this case, the TbCo film and the CoFe film). A pinning site is formed by the precipitated crystals 28.

The plurality of crystals 28 randomly oriented in the film make the amorphous phases 29 in the film discontinuous or reduce the size (volume) of one piece of amorphous phases 29. As a result, the amorphous phases 29 is less likely to be crystallized. Alternatively, the crystals 28 randomly included in the film prevent the atoms constituting the amorphous phases 29 from being regularly re-oriented by heat. Therefore, even when a large amount of heat is applied to the TbCoFe film 21, the crystals 28 in the film are considered to prevent change of the crystal structure of the TbCoFe film 21, i.e., crystallization of the amorphous phases 29. As a result, the perpendicular magnetic anisotropy of the amorphous phases 29 is maintained even when the heat treatment is performed at 300° C. or more.

In view of the above facts, even when the heat treatment is applied to the MTJ element, the TbCoFe film is not deteriorated by heat, and the deterioration of the characteristics of the MTJ element including the TbCoFe film are considered to be prevented.

As described above, since the TbCoFe film 21 of the MTJ element according to the present embodiment includes the amorphous phases 29 and the crystals 28 of 0.5 nm or more, the heat resistance of the MTJ element having the TbCoFe film 21 is ensured.

Therefore, according to the magnetoresistive effect element according to the present embodiment, the element characteristics can be improved.

(c-2) Relationship Between Magnetic Characteristics and Composition Ratio of Perpendicular Magnetic Film Relationship between the composition of the perpendicular magnetic film (in this case, the TbCoFe film) 21 included in the MTJ element 1A according to the present embodiment and the magnetic characteristics of the magnetic film will be explained with reference to FIGS. 8 to 11. The numerical values as shown in FIGS. 8 to 11 are examples, and the present embodiment is not limited by the numerical values as shown in FIGS. 8 to 11.

FIGS. 8 and 9 illustrate relationship between the magnetic characteristics and the composition ratio of Fe in the CoFe film 23 for forming the TbCoFe film. As shown in FIGS. 8 and 9, the magnetic characteristics in the TbCoFe film 21 can be changed by changing the concentration of Fe included in the CoFe film 23. For example, when the composition ratio of Fe in the CoFe film 23 is increased, a saturation magnetization Ms, a magnetic switching field Hc, and a perpendicular magnetic anisotropy constant Ku of the TbCoFe film can be increased.

More specifically, for example, when the TbCo film and the CoFe film are stacked to form the TbCoFe film, the magnetic characteristics of the TbCoFe film can be improved by increasing the concentration of Fe in the CoFe film.

FIG. 8 illustrates relationship between magnetic switching field of the magnetic layer and a composition ratio of Fe with respect to Co in the Co Fe film 23 for forming the TbCoFe film, in the magnetic layer (the reference layer including the interface layer) having the structure including TbCoFe/CoFeB/Ta/CoFeB.

The vertical axis of the graph as shown in FIG. 8 represents the magnetic switching field Hc (unit: Oe) of the magnetic layer. The horizontal axis of the graph as shown in FIG. 8 represents the concentration of Fe (unit: vol. %) in each CoFe film in the CoFe/TbCo stacked film for forming the TbCoFe film.

FIG. 9 illustrates relationship between saturation magnetization of the magnetic layer and a composition ratio of Fe with respect to Co in the CoFe film 23 for forming the TbCoFe film, in the magnetic layer (the reference layer including the interface layer) having the structure including TbCoFe/CoFeB/Ta/CoFeB.

The vertical axis of the graph as shown in FIG. 9 represents the saturation magnetization Ms (unit: emu/cc) of the magnetic layer. The horizontal axis of the graph as shown in FIG. 9 represents the concentration of Fe (unit: vol. %) in each CoFe film in the CoFe/TbCo stacked film for forming the TbCoFe film.

FIGS. 8 and 9 also show a case where the CoFe film does not include Fe (Fe: 0 vol. %) or does not include Co (Fe: 100 vol. %) in the CoFe/TbCo stacked film. When the CoFe film does not include Fe, the structure of the stacked film for forming the perpendicular magnetic film is Co/TbCo. When the CoFe film does not include Co, the structure of the stacked film for forming the perpendicular magnetic film is Fe/TbCo.

As shown in FIG. 8, when the concentration of Fe in the CoFe/TbCo stacked film increases, the magnetic switching field of the magnetic layer (reference layer) improves. On the other hand, as shown in FIG. 9, when the concentration of Fe in the CoFe/TbCo stacked film increases, the saturation magnetization of the magnetic layer (reference layer) improves.

As described above, when the concentration of Fe in the TbCoFe film (stacked film for forming the TbCoFe film) is increased, the magnetic switching field and the saturation magnetization of the magnetic layer (perpendicular magnetic film) can be improved. Accordingly, the perpendicular magnetic anisotropy constant Ku of the magnetic layer can be increased.

When the TbCoFe film (or the TbFe film) is used in the reference layer of the perpendicular magnetization, the increase of the perpendicular magnetic anisotropy constant Ku contributes to improvement of the thermal stability of the reference layer.

Therefore, when the magnetization direction of the recording layer 10 is changed in (i.e., data are written to) the MTJ element according to the present embodiment, the spin torque applied to the reference layer 20 can prevent reversal of the magnetization of the reference layer 20.

As shown in FIGS. 10 and 11, the magnetic characteristics of the TbCoFe film 21 can be changed by changing the composition of Tb in the film 21.

For example, when the composition of Tb in the TbCoFe film 21 is changed, the saturation magnetization Ms of the TbCoFe film can be changed.

FIG. 10 illustrates relationship between magnetic switching field of the magnetic layer and a composition ratio of Tb in the TbCoFe film 21, in the magnetic layer (the reference layer including the interface layer) having the structure including TbCoFe/CoFeB/Ta/CoFeB.

The vertical axis of the graph as shown in FIG. 10 represents the magnetic switching field Hc (unit: Oe) of the magnetic layer. The horizontal axis of the graph as shown in FIG. 10 represents the concentration of Tb (unit: atomic %) in the TbCoFe film 21.

FIG. 11 illustrates relationship between saturation magnetization of the magnetic layer and a composition ratio of Tb in the TbCoFe film 21, in the magnetic layer (the reference layer including the interface layer) having the structure including TbCoFe/CoFeB/Ta/CoFeB.

The vertical axis of the graph as shown in FIG. 11 represents the saturation magnetization Ms (unit: emu/cc) of the magnetic layer. The horizontal axis of the graph as shown in FIG. 11 represents the concentration of Tb (unit: atm. %) in the TbCoFe film 21.

As shown in FIGS. 10 and 11, the magnetic switching field Hc of the magnetic layer having the stacked structure including TbCoFe/CoFeB/Ta/CoFeB attains the maximum value when the concentration of Tb in the TbCoFe film 21 increases to a predetermined value. The concentration of the Tb film at which the magnetic switching field Hc of the TbCoFe/CoFeB/Ta/CoFeB layer attains the maximum value is referred to as a compensation point. In FIG. 10, the compensation point of TbCoFe/CoFeB/Ta/CoFeB layer is obtained when the concentration of Tb is about 20 atomic % to about 22 atomic %. When the concentration of the Tb film of the Tb CoFe/CoFeB/Ta/CoFeB layer attains a value more than the compensation point, the magnetic switching field Hc of the TbCoFe/CoFeB/Ta/CoFeB layer decreases.

As the magnetic switching field Hc increases to the compensation point of the magnetic layer of the TbCoFe/CoFeB/Ta/CoFeB structure, the saturation magnetization Ms of the magnetic layer of the TbCoFe/CoFeB/Ta/CoFeB structure decreases. Then, when the concentration attains a value more than the compensation point (Tb concentration: about 20 atomic %), the saturation magnetization Ms of the TbCoFe/CoFeB/Ta/CoFeB layer increases.

In the MTJ element, the magnetostatic stray field applied from the reference layer 20 to the recording layer 10 is preferably reduced. Therefore, the magnitude of the saturation magnetization Ms of the reference layer 20 is preferably reduced. According to the MTJ element according to the present embodiment, the saturation magnetization of the reference layer 20 including the TbCoFe film 21 can be reduced by adjusting the concentration of Tb in the TbCoFe film 21.

As shown in FIGS. 8 and 9, when the concentration of Fe in the TbCoFe film 21 increases, both the magnetic switching field Hc and the saturation magnetization Ms increase.

As shown in FIGS. 10 and 11, when the concentration of Tb in the TbCoFe film 21 increases to the compensation point, the magnetic switching field Hc of the TbCoFe film 21 increases, but the saturation magnetization Ms of the TbCoFe film 21 decreases.

Therefore, as shown in FIGS. 8 to 11, the magnetic layer (the reference layer or the recording layer) having predetermined magnetic characteristics can be formed by changing the composition ratios of elements constituting the TbCoFe film.

The film thickness of the reference layer 20 including the TbCoFe film 21 according to the present embodiment can be reduced by reducing the stacked layer cycle of the stacked film (for example, CoFe/TbCo films) for forming the TbCoFe film.

In the above example, 20 cycles of CoFe/TbCo films are stacked. When the film thickness of the TbCo film is 3 Å (0.3 nm) and the film thickness of the CoFe film is 3 Å (0.3 nm), the TbCoFe film of 120 Å (12 nm) is formed by the 20 cycles of CoFe/TbCo films. Even when 5 cycles of CoFe/TbCo films are formed, and the TbCoFe film having a film thickness of 30 Å (3 nm) is formed, the TbCoFe film 21 has perpendicular magnetic anisotropy.

Even when the film thickness of the TbCoFe film 21 is about 30 Å (3 nm), the TbCoFe film 21 includes the amorphous phases and the crystals. Therefore, even when the number of cycles of the stacked film for forming the TbCoFe film is reduced, and the TbCoFe film becomes thinner, the TbCoFe film 21 used in the MTJ element according to the present embodiment has high heat resistance.

As described above, the film thickness of the reference layer (TbCoFe film) can be reduced by reducing the number of cycles (the number of stacks). Accordingly, it is possible to reduce an aspect ratio (step between the upper surface of the MTJ element and the substrate) generated when the MTJ element is formed, and it becomes easier to process the MTJ element.

It should be noted that the combination of the stacked films for forming the TbCoFe film 21 is not limited to the stacked structure including the TbCo film and the CoFe film. For example, a stacked film including a TbFe film and a CoFe film, a stacked film including a TbCo film and an Fe film, a stacked film including a TbCo film and a Co film, a stacked film including a TbFe film and a Co film, a stacked film including a TbFe film and an Fe film, a stacked film including a TbCoFe film and a Fe film, a stacked film including a TbCoFe film and a Co film, or a stacked film including a TbCoFe film and a CoFe film may be used in the multi-layer film 21A for forming the TbCoFe film.

In stead of Tb, Dy may be used in the TbCoFe film 21. In this case, the DyCoFe film is used as the reference layer 20 of the MTJ element 1A as shown in FIG. 2. A portion of Tb in the TbCoFe film 21 may be replaced with Dy. In this case, the TbDyCoFe film is used as the reference layer 20 of the MTJ element 1A. The MR ratio of the MTJ element can be improved by replacing a portion or all of Tb in the TbCoFe film 21 with Dy.

Further, in the TbCoFe film 21, Gd may be used instead of Tb. In this case, the GdCoFe film is used as the reference layer 20 of the MTJ element 1A as shown in FIG. 2. A portion of Tb in the TbCoFe film 21 may be replaced with Gd. In this case, the TbGdCoFe film is used as the reference layer 20 of the MTJ element 1A. The Curie temperature Tc of the MTJ element can be improved by replacing a portion or all of Tb in the TbCoFe film 21 with Gd.

The DyCoFe film, the TbDyCoFe film, the GdCoFe film, or the GdTbCoFe film also includes amorphous phases and crystals whose average crystal particle sizes are less than or equal to 3 nm, preferably less than or equal to 1 nm, and whose particle sizes are greater than or equal to 0.5 nm.

As described above, the magnetic characteristics of the magnetic layer used in the magnetoresistive effect element can be controlled by adjusting the composition of the perpendicular magnetic film (for example, a TbCoFe film) including the amorphous phases and the crystals.

Therefore, according to the magnetoresistive effect element according to the present embodiment, the element characteristics can be improved.

(d) Structure of Interface Layer of Reference Layer

The structure of the interface layer in the reference layer will be explained with reference to FIGS. 12 to 16B.

As shown in FIG. 2, in the magnetoresistive effect element (MTJ element), the interface layer 22 is provided between the TbCoFe film 21 and the tunnel barrier layer 30 (for example, an MgO film). In this manner, the interface layer 22 is provided in the reference layer 20, so that the MR ratio of the MTJ element is improved.

For example, a CoFeB film is used as the interface layer 22. The CoFeB film having had no heat treatment immediately after the deposition (as-deposit) has an amorphous structure. When a single-layer CoFeB film is provided between the TbCoFe film and the MgO film, and the CoFeB film is subjected to the heat treatment, the crystals in the CoFeB film are oriented along the bcc (001) plane and planes equivalent thereto with the MgO film being the underlayer. This crystallization of the CoFeB film improves the MR ratio of the MTJ element.

However, when the temperature of the heat treatment is greater than or equal to 350° C., the crystallized CoFeB film functions as the underlayer for the TbCoFe film, and the crystals in the amorphous TbCoFe film (TbCoFe film without microcrystal) are also oriented in the bcc (001) plane and planes equivalent thereto. As a result, the perpendicular magnetic anisotropy of the amorphous TbCoFe film is deteriorated.

Figure 12:
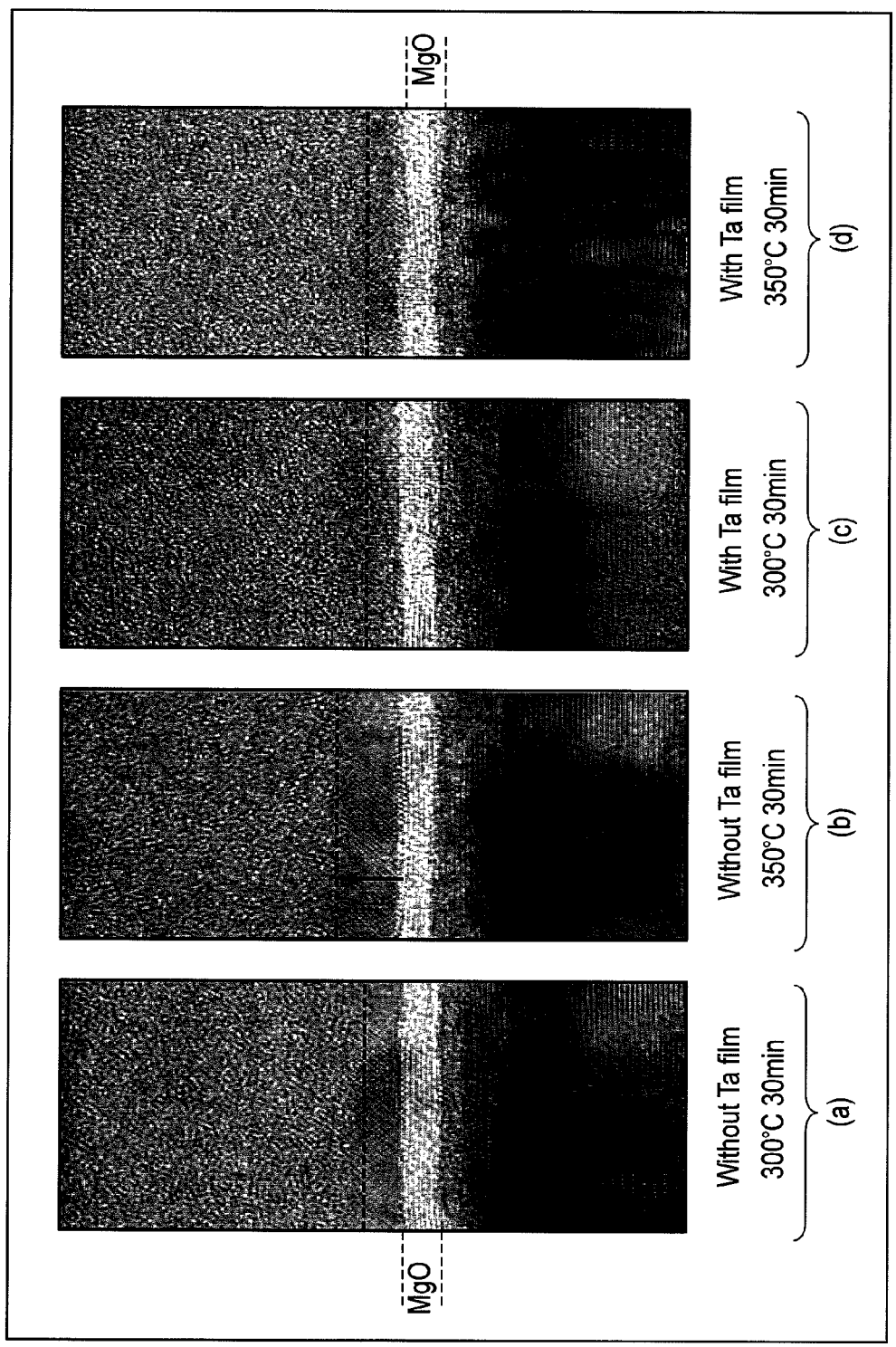
FIG. 12 is a figure illustrating cross-sectional structures of the magnetic layer of the magnetoresistive effect element.
Figure 13:
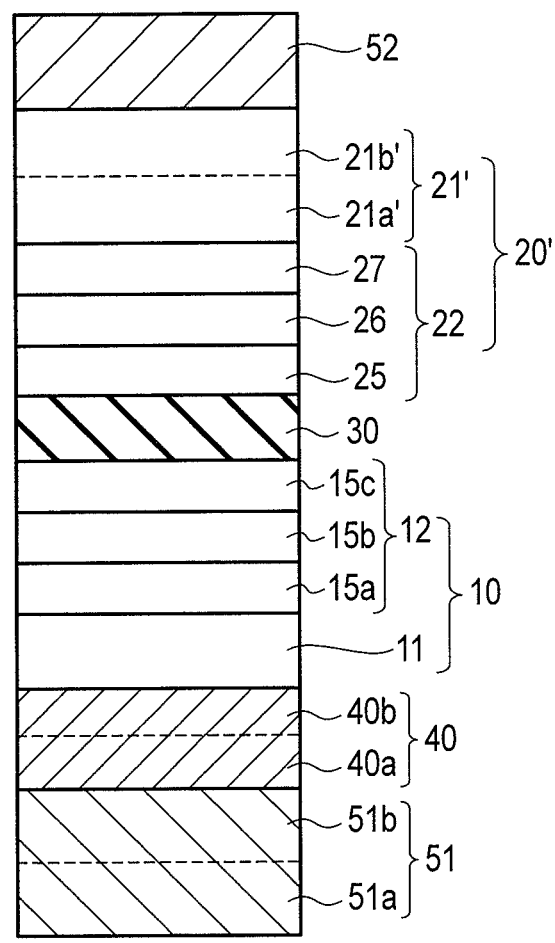
FIG. 13 is a figure illustrating an exemplary structure of a magnetoresistive effect element.

FIG. 12 illustrates observation results of the MTJ element with the TEM when the heating temperature and the structure of the interface layer are changed. FIG. 13 illustrates a structure of the MTJ element used for the observation with the TEM.

The structure of the MTJ element used for the observation is as follows.

The lower electrode 51 is provided on the substrate (not shown). The lower electrode 51 has a structure in which a Ta film 51b is stacked on a W film 51a, and the film thickness of the Ta film 51b is 50 Å (5 nm).

The underlayer 40 is provided on the lower electrode 51. The underlayer 40 has a structure in which an Ir film 40b is stacked on an Ru film 40a. The film thickness of the Ru film 40a is set at about 50 Å (5 nm), and the film thickness of the Ir film 40b is set at about 30 Å (3 nm). The underlayer 40 has an atom close-packed plane. The crystals in the Ru film 40a are oriented in the hcp (0001) plane (orientation) in order to control the crystal orientation of the Ir film 40b.

The recording layer 10 having the multi-layer structure is provided on the underlayer 40. The recording layer 10 has the interface layer 12.

In the recording layer having the multi-layer structure, the PdCo film 11 is provided between the underlayer 40 and the interface layer 12 of the recording layer 10. The PdCo film is a perpendicular magnetic film.

The PdCo film 11 is formed by depositing the stacked film including the Pd film and the Co film during deposition of the films. The stacked film including the Pd film and the Co film is formed with two cycles of Pd/Co stacked films. In other words, during deposition of the films, the Pd/Co stacked film is made with the two Co films and the two Pd films. During deposition of the films, each Co film is deposited to have a thickness of 3.5 Å (0.35 nm), and each Pd film is deposited to have a thickness of 3.5 Å (0.35 nm). During deposition of the films, the Co film serves as the lowermost layer in the stacked structure, and the Co film is deposited to be in contact with the upper surface of the underlayer.

The interface layer 12 of the recording layer 10 is provided on the PdCo film 11. The interface layer 12 of the recording layer 10 has the structure including CoFeB/Ta/CoFeB. The CoFeB film 15a in the lower layer (at the side of the PdCo film) has a film thickness of 5 Å (0.5 nm). The CoFeB film 15c in the upper layer (at the side of the nonmagnetic layer) has a film thickness of 9 Å (0.9 nm). The Ta film 15b sandwiched by the two CoFeB films has a film thickness of 3 Å (0.3 nm).

The recording layer 10 is formed on the underlayer having an atom close-packed plane, so that the recording layer 10 becomes the perpendicular magnetic film.

The MgO film 30 serving as the tunnel barrier layer (nonmagnetic layer) is provided on the interface layer 12 of the recording layer 10. The MgO film 30 has a film thickness of 10 Å (1 nm). The crystals in the MgO film 30 are oriented in the (001) plane and planes equivalent thereto (for example, the (002) plane). It is to be understood that the crystal orientation of the MgO film in the (001) plane is equivalent to the orientation of the MgO film in [001] orientation (<001> orientation).

A reference layer 20' is provided on the MgO film 30. The reference layer 20' includes the interface layer 22 and a TbCoFe film 21'.

The interface layer 22 of the reference layer 20' is provided between the TbCoFe film 21' and the MgO film 30. In the present embodiment, the interface layer 22 has a multi-layer structure including CoFeB/Ta/CoFeB. In other words, in the present embodiment, the interface layer 22 has a structure in which the Ta film is inserted between the two CoFeB films 25, 27.

The CoFeB film 25 in the lower layer (at the side of the nonmagnetic layer) has a film thickness of 12 Å (1.2 nm). The CoFeB film 27 in the upper layer has a film thickness of 5 Å (0.5 nm). The Ta film 26 sandwiched between the two CoFeB films has a film thickness of 3 Å (0.3 nm).

The CoFeB film 25 in the lowermost layer of the interface layer 22 is in contact with the MgO film (tunnel barrier layer) 30 oriented in the (001) plane.

The TbCoFe film 21' is provided on the interface layer 22. The TbCoFe film has a film thickness of 120 Å (12 nm).

The upper electrode 52 is provided on the TbCoFe film 21'. The upper electrode 52 has a stacked structure including an Ru film 52b and a Ta film 52a. The Ta film 52a in the lower layer has a film thickness of 50 Å (5 nm). The Ru film 52b in the upper layer has a film thickness of 200 Å (20 nm).

Not only a sample having the Ta film 26 inserted into the interface layer 22 of the reference layer 20' but also a sample not having any Ta film inserted into the interface layer 22 of the reference layer 20' are made and measured in order to compare the effect of the heat treatment.

FIG. 12 shows a sample having been subjected to heat treatment at 300° C. for 30 minutes and a sample having been subjected to heat treatment at 350° C. for 30 minutes.

Images (a) and (b) of FIG. 12 show cross-sectional images, obtained with the TEM, of the sample not having any Ta film inserted into the CoFeB film of the interface layer 22 of the reference layer 20'. Image (a) of FIG. 12 corresponds to the sample having been subjected to the heat treatment at 300° C. Image (b) of FIG. 12 corresponds to the sample having been subjected to the heat treatment at 350° C.

Images (c) and (d) of FIG. 12 show cross-sectional images, obtained with the TEM, of the sample using the interface layer of the reference layer according to the present embodiment, i.e., the sample having the Ta film 26 inserted into the CoFeB film 25, 27 of the interface layer 22 of the reference layer 20'. Image (c) of FIG. 12 corresponds to the sample having been subjected to the heat treatment at 300° C. Image (d) of FIG. 12 corresponds to the sample having been subjected to the heat treatment at 350° C.

As shown in images (a) and (b) of FIG. 12, when the sample having been subjected to the heat treatment at 350° C. (image (b) of FIG. 12) is compared with the sample having been subjected to the heat treatment at 300° C. (image (a) of FIG. 12), in a case where the Ta film is not inserted into the CoFeB film of the interface layer 22 of the reference layer 20', the interface between the TbCoFe film 21' and the CoFeB film 27 in the sample having been subjected to the heat treatment at 350° C. (image (b) of FIG. 12) is moved upward (toward the TbCoFe film 21'). In other words, as shown in image (b) of FIG. 12, the film thickness of the interface layer 22 is thicker than the film thickness of the interface layer 22 of the sample in image (a) of FIG. 12.

This indicates that when the heat treatment is performed at 350° C., the crystals in the interface layer 22 are oriented in the (001) plane while the MgO film 30 oriented in (001) serves as the underlayer for the interface layer 22, and along with the crystallization of the interface layer 22, the crystals in the TbCoFe film 21a' at the side of the interface layer 22 are oriented in the bcc (001) plane and planes equivalent to the (001) plane by the heat treatment. In the TbCoFe film 21', the TbCoFe film 21b' at the side of the upper electrode is less affected by the crystallization.

In contrast, as shown in the images (c) and (d) of FIG. 12, when the Ta film 26 is inserted into the CoFeB films 25, 27 of the interface layer 22 of the reference layer 20' (in the case of the present embodiment), the position of the interface between the TbCoFe film 21' and the CoFeB film 27 and the film thickness of the TbCoFe film 21' hardly changes even if the heat treatment is performed at 350° C. Therefore, when the Ta film is inserted into the CoFeB film of the interface layer, the crystallization growth of the TbCoFe film 21' using the MgO layer oriented in (001) as the underlayer is prevented.

Each of the graphs in FIG. 14 shows the magnetic characteristics of the MTJ element observed with the TEM as shown in FIG. 12.

Graphs (a) and (b) of FIG. 14 show the magnetic characteristics of the element when the Ta film is not inserted into the interface layer 22 of the reference layer 20. Graphs (a) and (b) of FIG. 14 correspond to the samples in images (a) and (b) of FIG. 12, respectively. Graph (a) of FIG. 14 shows the magnetic characteristics of the MTJ element (magnetic layer) having been subjected to the heat treatment at 300° C. Graph (b) of FIG. 14 shows the magnetic characteristics of the MTJ element having been subjected to the heat treatment at 350° C.

Graphs (c) and (d) of FIG. 14 show the magnetic characteristics of the MTJ element in which the Ta film 26 is inserted into the interface layer 22 of the reference layer 20. Graphs (c) and (d) of FIG. 14 correspond to the samples in images (c) and (d) of FIG. 12, respectively. Graph (c) of FIG. 14 shows the magnetic characteristics of the MTJ element (magnetic layer) having been subjected to the heat treatment at 300° C. Graph (d) of FIG. 14 shows the magnetic characteristics of the MTJ element having been subjected to the heat treatment at 350° 0.

The magnetic characteristics as shown in FIG. 14 shows an M-H curve of each MTJ element.

In each of graphs (a) to (d) in FIG. 14, the horizontal axis of the graph corresponds to an applied magnetic field H (unit: kOe), and the vertical axis of the graph corresponds to a magnetization M (unit: emu) of the MTJ element (magnetic layer).

As shown in graph (b) of FIG. 14, when the temperature of the heat treatment applied to the MTJ element reaches about 350° C., the perpendicular magnetic anisotropy of the element deteriorates.

As shown in graph (b) of FIG. 14, when the perpendicular magnetic characteristics deteriorate, this will cause decrease of retention energy of the MTJ element, larger distribution in the element characteristics, increase of the write current, and decrease of read output, which cause serious problems in the operational characteristics and reliability of the MTJ element and the memory using the MTJ element.

On the other hand, as shown in graph (d) of FIG. 14, when the Ta film 26 is inserted between the CoFeB films 25, 27 serving as the interface layer 22, the perpendicular magnetic anisotropy of the element hardly deteriorates even when the heat treatment is executed at about 350° C.

Therefore, when the Ta film 26 is inserted between the CoFeB films 25, 27 serving as the interface layer 22 for the reference layer 20' as shown in the present embodiment, the crystallization of the TbCoFe film 21' (perpendicular magnetic film) in the (001) plane is prevented in the reference layer 20' even if high temperature (for example, 350° C. or more) heat treatment is executed. Therefore, deterioration of the perpendicular magnetic anisotropy of the reference layer can be prevented.

Figure 16A:
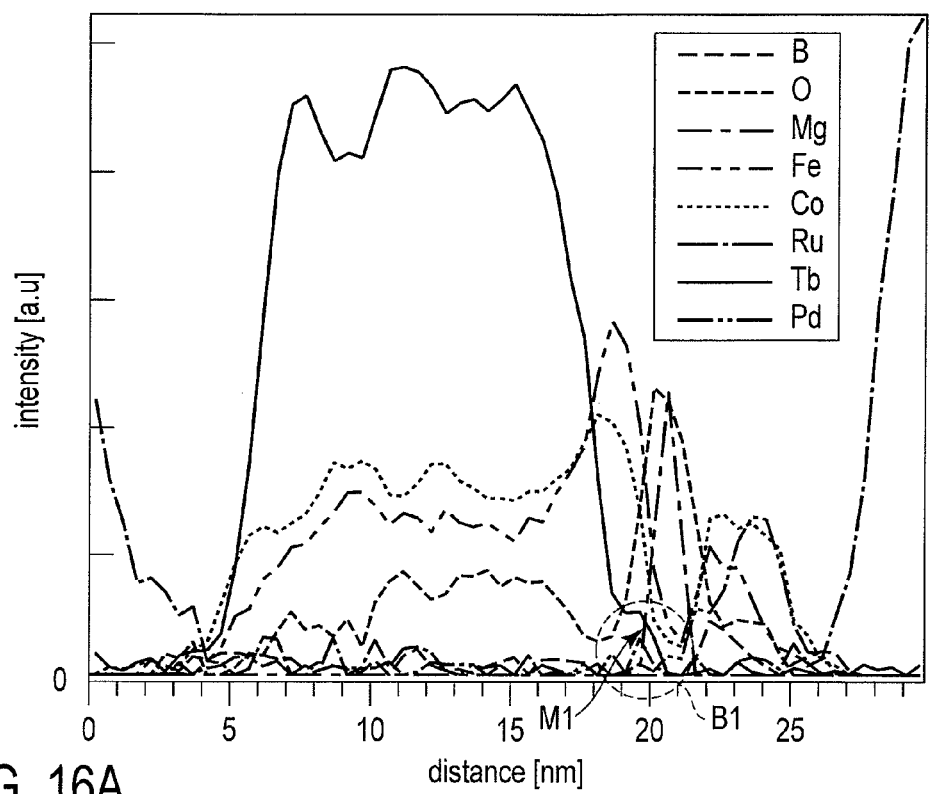
FIG. 16A is a graph illustrating an analysis result of EELS.
Figure 16B:
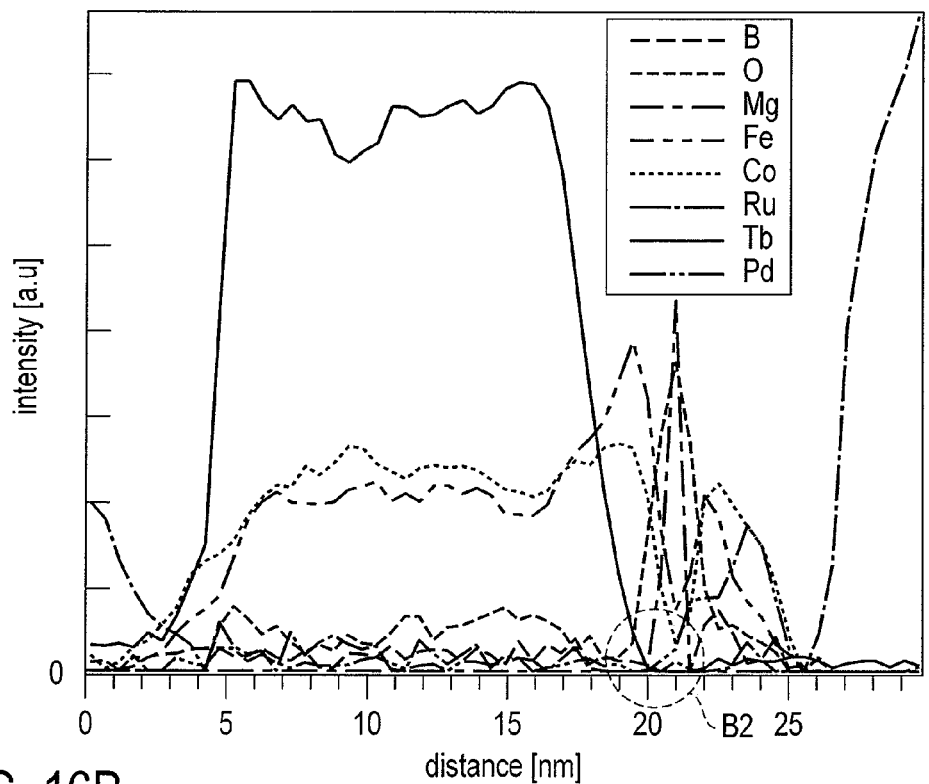
FIG. 16B is a graph illustrating an analysis result of EELS.

FIGS. 15A, 15B, 16A, and 16B illustrate measurement results of electron energy-loss spectroscopy (EELS). FIGS. 15A and 15B illustrate EELS measurement results of the MTJ element when the heat treatment is executed at 300° C. for 30 minutes. FIGS. 16A and 16B illustrate EELS measurement results of the MTJ element when the heat treatment is executed at 350° C. for 30 minutes In FIGS. 15A to 16B, the horizontal axis of each graph corresponds to a depth from the upper surface of the element in a direction in which the films are stacked (unit: nm), and the vertical axis of each graph corresponds to a detected signal strength (arbitrary unit).

FIGS. 15A and 16A illustrate EELS analysis results of the MTJ element in which the Ta film 26 is not provided in the interface layer 22. FIGS. 15B and 16B illustrate EELS analysis results of the MTJ element according to the present embodiment in which the Ta film 26 is provided in the interface layer 22.

In FIGS. 15A to 16B, a position (depth) where the detection intensity of Mg is high corresponds to the position of the MgO film in the element.

As shown in FIGS. 15A and 16A, when the Ta film is not provided in the interface layer, Tb (solid line in the graph) is detected in a portion where the detection peak of Mg appears (region indicated as A1 or B1 in the graph). This indicates that Tb diffuses into the MgO film or a portion in proximity to the interface between the MgO film and the CoFeB film.

On the other hand, as shown in FIGS. 15B and 16B, when the Ta film 26 is provided in the interface layer 22, Tb (solid line in the graph) is hardly detected in the portion where the detection peak of Mg appears (regions A2, B2) even if the heat treatment is performed at 350° C. In other words, when the Ta film 26 is provided (inserted) in the interface layer 22, Tb in the TbCoFe film 21' can be prevented from diffusing into the MgO film 30 or a portion in proximity to the MgO film 30.

As described above, the Ta film 26 inserted between the CoFeB films 25, 27 serving as the interface layer 22 prevents Tb included in the TbCoFe film 21' from diffusing into the interface between the interface layer (CoFeB film) and the tunnel barrier layer (MgO film) 30. The Ta film 26 in the interface layer 22 functions as diffusion prevention film for Tb.

As described above, when the Ta film 26 is inserted between the CoFeB films 25, 27 serving as the interface layer 22 for the reference layer 20, the crystallinity of the CoFeB film in the interface layer 22 can be improved while preventing the crystallization of the TbCoFe film 21'. In addition, the interface layer 22 has the multi-layer structure including the Ta film 26, so that Tb in the TbCoFe film can be prevented from diffusing into the tunnel barrier layer (MgO film) or a portion in proximity to the tunnel barrier layer.

Therefore, the MTJ element according to the present embodiment can attain a high MR ratio.

In this case, the Ta film 26 is provided between the two CoFeB films 25, 27. Alternatively, instead of the Ta film 26, a tungsten (W), niobium (Nb), or molybdenum (Mo) film may be used as long as it is high melting point metal. For example, the Ta film (or W film, Nb film, Mo film) is inserted in-situ during deposition of the CoFeB film.

Figure 17:
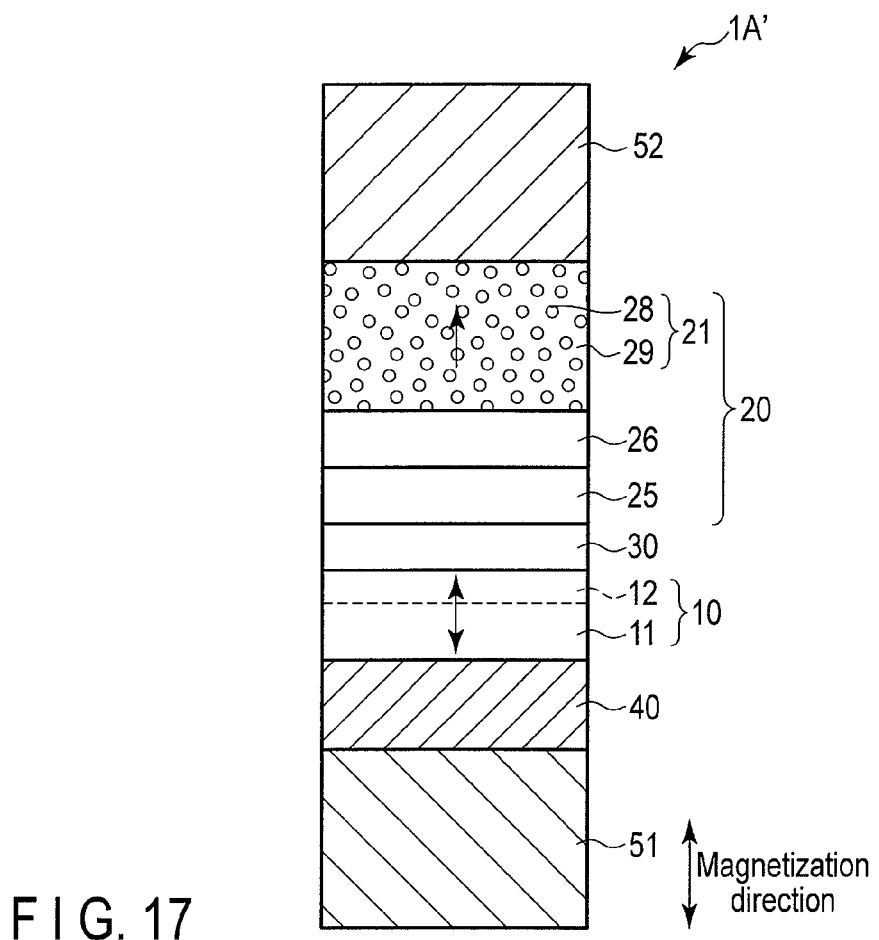
FIG. 17 is a cross-sectional view illustrating a structure of a modification example of the magnetoresistive effect element according to the first embodiment.

It should be noted that the CoFeB film 27 may not be provided. In this case, as shown in FIG. 17, the structure is such that a metal film 26 is provided between the perpendicular magnetic film 21 and the interface layer 25, and the TbCoFe film is in contact with the Ta film (or W film, Nb film, Mo film). As described above, even if the CoFeB film 27 is not provided, the MTJ element according to the present embodiment can attain a high MR ratio.

In the two CoFeB films 25, 27 sandwiching the Ta film 26, the CoFeB film 25 at the side of the tunnel barrier layer 30 and the CoFeB film 27 at the side of the perpendicular magnetic film 21 may have different composition ratios of Co, Fe, and B. For example, a CoB film or a CoFe film may be used instead of the CoFeB film. In the above case, the CoFeB film is used as the interface layer 22. However, other materials may be used as the interface layer 22.

In this case, for example, the Tb CoFe film is formed in the reference layer. However, it is to be understood that even when Gd and Dy are used instead of Tb, the same effects can be obtained.

(e) Conclusion

In a process of manufacturing the MTJ element or a magnetic memory using the MTJ element (for example, an MRAM), the magnetic layer and the MTJ element may be exposed to a process condition of a high temperature (for example, 350° C. or more) in order to improve the crystallinity of the nonmagnetic layer (for example, an MgO film) and the storage layer and form constituent members. In such high-temperature heat treatment, the amorphous perpendicular magnetic film serving as the magnetic layer of the MTJ element is deteriorated, and accordingly, the characteristics of the MTJ element are deteriorated.

The perpendicular magnetic film (for example, a TbCoFe film) including the amorphous phases and the crystals is used in the magnetic layer (for example, a reference layer) of the MTJ element according to the present embodiment. As a result, the heat resistance of the element improves, and the element characteristics can be improved without being adversely affected by the heating.

An interface layer may be provided between the TbCoFe film and the tunnel barrier layer. In the MTJ element according to the present embodiment, the Ta film (or W film) is inserted into the interface layer (for example, a CoFeB film), and the interface layer having the multi-layer structure including the Ta film or the W film is formed, such as CoFeB/Ta/CoFeB film.

When the Ta film (or W film, Nb film, or Mo film) is inserted into the interface layer 22, the crystallization of the amorphous perpendicular magnetic film (for example, a TbCoFe film) caused by the crystallization of the interface layer can be prevented. Further, this prevents Tb in the TbCoFe film from diffusing into the tunnel barrier layer (for example, an MgO film) and a portion in proximity to the interface between the interface layer and the tunnel barrier layer.

Therefore, the element characteristics of the perpendicular magnetization-type magnetoresistive effect element according to the present embodiment hardly deteriorate even when the heat treatment is executed.

As described above, the element characteristics of the magnetoresistive effect element according to the first embodiment can be improved.

(3) Second Embodiment

A magnetoresistive effect element according to the second embodiment will be explained with reference to FIGS. 18 and 19. In the magnetoresistive effect element according to the second embodiment, detailed description about substantially the same members as those in the magnetoresistive effect element according to the first embodiment is omitted.

The magnetoresistive effect element according to the first embodiment is the top pin-type MTJ element, in which the recording layer of the perpendicular magnetization is provided below the tunnel barrier film.

Figure 18:
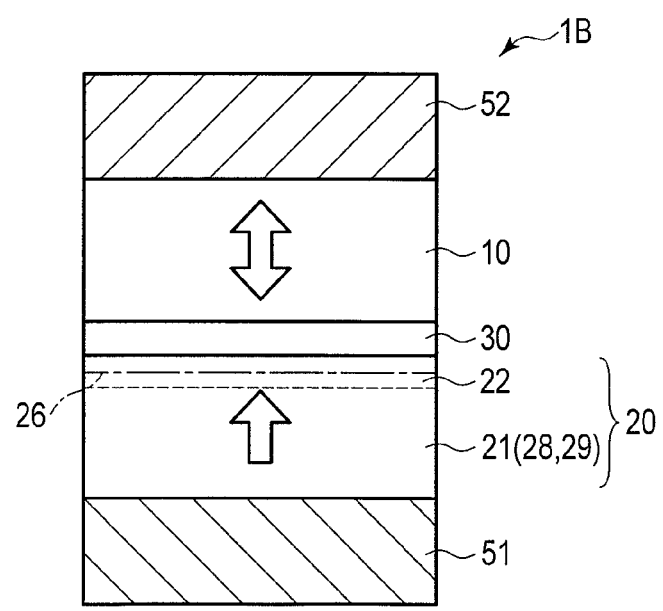
FIG. 18 is a cross-sectional view illustrating a structure of a magnetoresistive effect element according to the second embodiment.

As shown in FIG. 18, the magnetoresistive effect element according to the second embodiment (MTJ element) is a bottom pin-type MTJ element. In other words, on the contrary to the first embodiment, an MTJ element 1B according to the present embodiment has a recording layer 10 on a tunnel barrier film 30. A reference layer 20 is provided below the recording layer 10 with the tunnel barrier layer 30 interposed therebetween. The reference layer 20 includes a perpendicular magnetic film 21 and an interface layer 22. Like the first embodiment, the perpendicular magnetic film (for example, a TbCoFe film) 21 also includes amorphous phases 29 and crystals 28 in the present embodiment.

Figure 19:
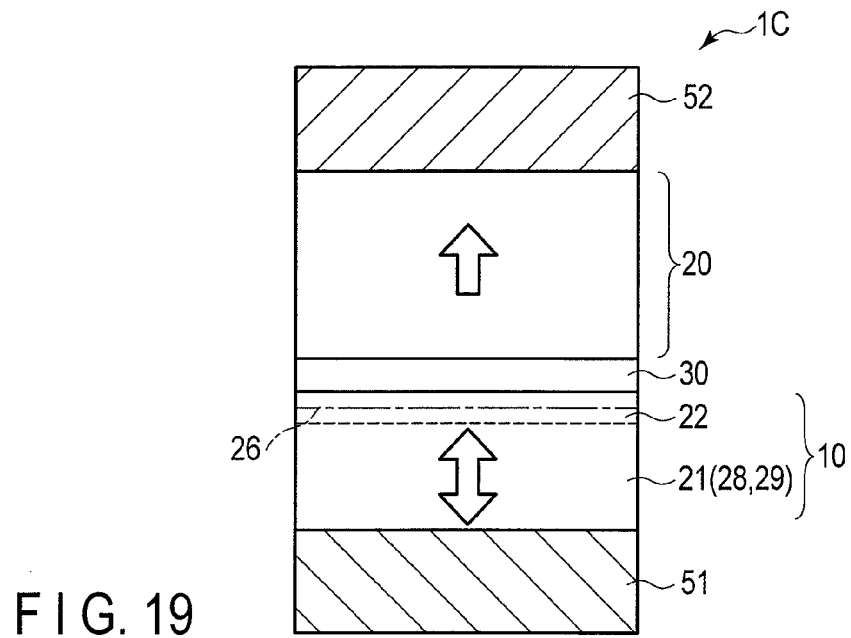
FIG. 19 is a cross-sectional view illustrating a structure of a magnetoresistive effect element according to the second embodiment.

As shown in FIG. 19, the perpendicular magnetic film including the amorphous phases 29 and the crystals 28 may also be used for a magnetic layer (recording layer) in which magnetization direction is variable.

Further, in the magnetoresistive effect elements 1B, 10 according to the present embodiment, a Ta film (or W film, Nb film, or Mo film) 26 is provided in the interface layer 22.

Therefore, like the first embodiment, the magnetoresistive effect elements 1B, 10 according to the second embodiment can improve the characteristics of the perpendicular magnetization-type magnetoresistive effect element.

(4) Third Embodiment

Figure 20:
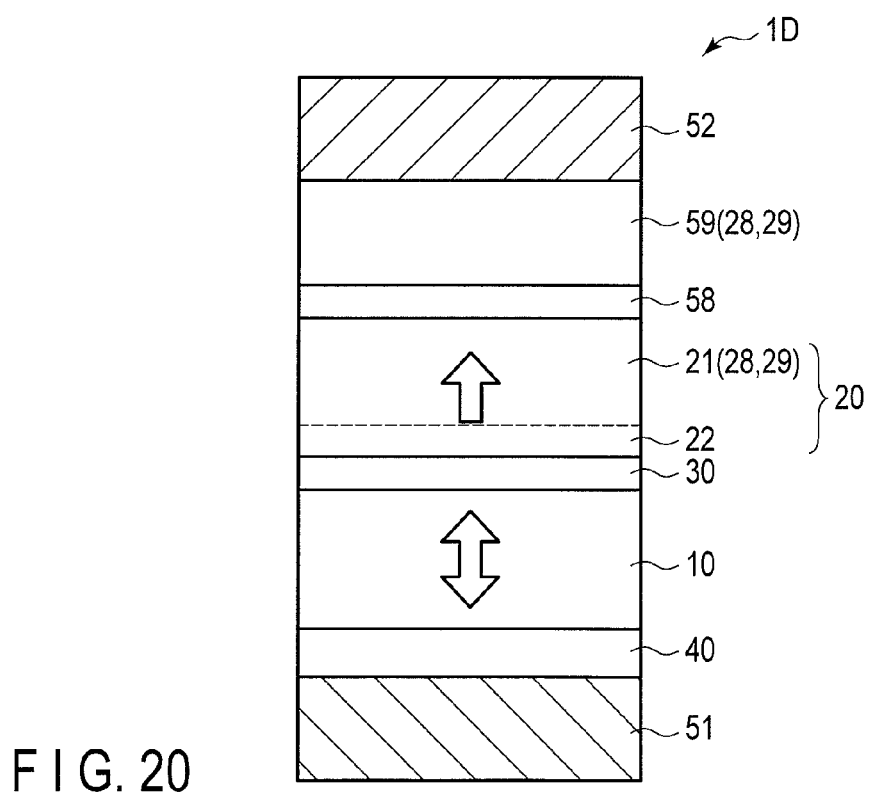
FIG. 20 is a cross-sectional view illustrating a structure of a magnetoresistive effect element according to the third embodiment.

A magnetoresistive effect element according to the third embodiment will be explained with reference to FIG. 20. In the magnetoresistive effect element according to the third embodiment, detailed description about substantially the same members as those in the magnetoresistive effect element according to the first embodiment is omitted.

A magnetoresistive effect element 1D according to the present embodiment is different from the magnetoresistive effect element according to the first and second embodiments in that a bias layer 59 is provided adjacent to a reference layer 20. A nonmagnetic layer 58 is provided between the bias layer 59 and the reference layer 21. A bottom surface (first surface) of a reference layer 20 is in contact with a tunnel barrier layer 30, and an upper surface (second surface) of the reference layer 20 is in contact with a nonmagnetic layer 58.

The bias layer 58 is a magnetic layer of perpendicular magnetization. For example, the magnetization direction of the bias layer 58 is opposite to the magnetization direction of the reference layer. The bias layer 58 prevents change of thermal stability between the parallel state and antiparallel state of the relationship of the magnetization directions of the reference layer and the recording layer caused by shift of the magnetic switching field Hc of the recording layer 10 affected by magnetostatic stray field from the reference layer 20.

An example of material that can be used as the bias layer 58 includes the perpendicular magnetic film cited as an example of material that can be used as the reference layer. That is, like the perpendicular magnetic film 21 in the reference layer 20, the bias layer 58 is formed using a magnetic film including amorphous phases 29 and crystals 28.

The material of the nonmagnetic layer 58 between the reference layer 20 and the bias layer 59 is preferably selected from such materials that make stable exchange bias when the magnetization direction of the reference layer 20 and the magnetization direction of the bias layer 59 are antiparallel. The material of the nonmagnetic layer 58 is preferably nonmagnetic metal. For example, the material of the nonmagnetic layer 58 is selected from Ru, silver (Ag), and Cu.

An interface layer such as CoFe, Co, Fe, CoFeB, CoB, and FeB between the nonmagnetic layer 58 (for example, Ru) and the perpendicular magnetic film serving as the reference layer 20 and the bias layer 59 may be provided in order to increase antiparallel coupling between the reference layer 20 and the bias layer 59 via the nonmagnetic layer 58. This enhances the antiparallel coupling between the reference layer 20 and the bias layer 59.

Therefore, in the magnetoresistive effect element according to the third embodiment, the element characteristics of the perpendicular magnetization-type magnetoresistive effect element can be improved, like the magnetoresistive effect element according to the first and second embodiment.

Application Example

An application example of the magnetoresistive effect element (MTJ element) according to the first to third embodiments will be explained with reference to FIGS. 21 to 24.

The above MTJ element according to the embodiments is used as a memory element in a magnetic memory such as a magnetoresistive random access memory (MRAM). For example, a spin-transfer-torque MRAM will be explained as the MRAM according to the application example.

(a) Configuration

Figure 21:
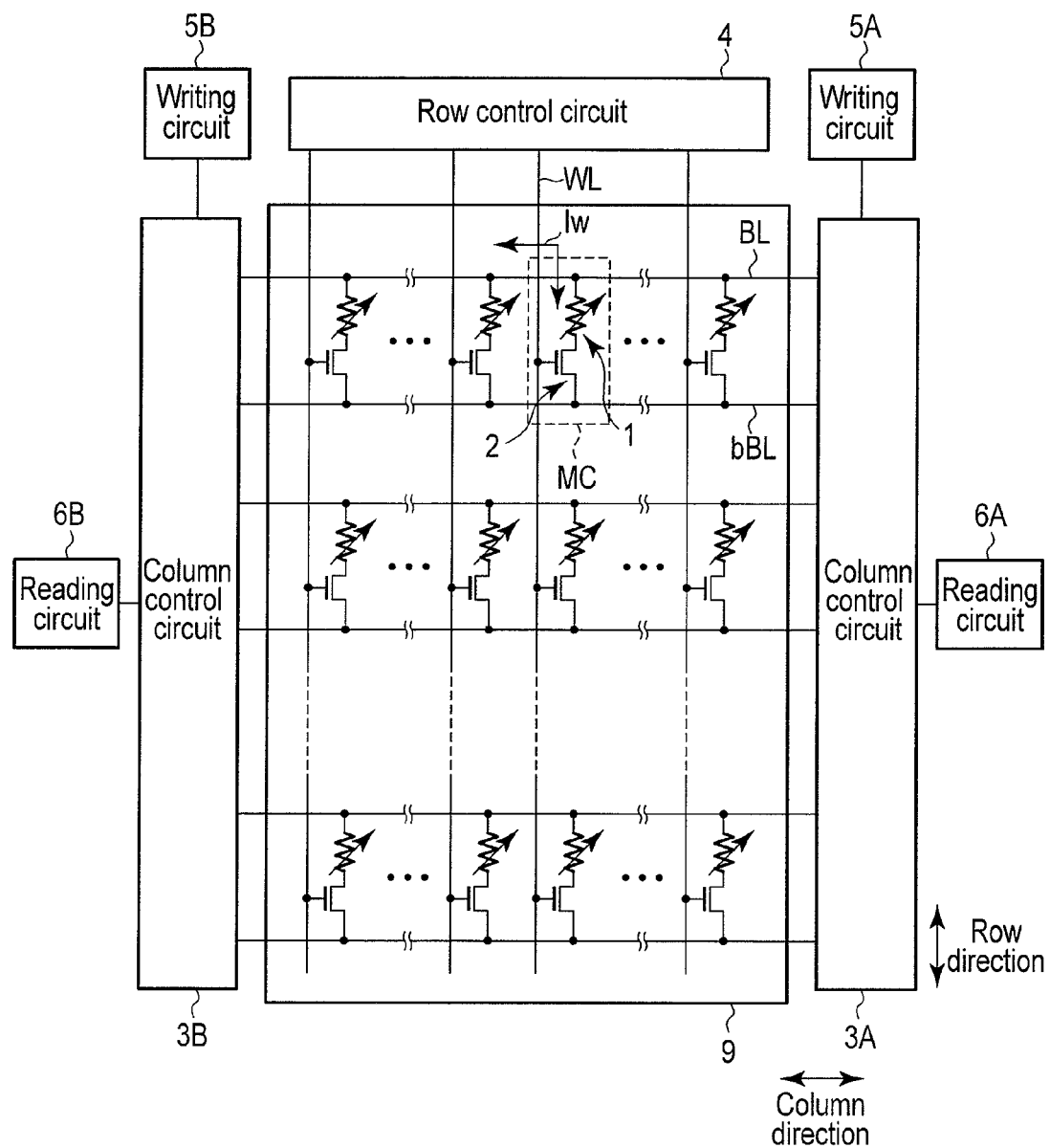
FIG. 21 is a circuit diagram illustrating an MRAM, i.e., an application example of the embodiment.

FIG. 21 is a figure illustrating a circuit configuration in a memory cell array of the MRAM and a circuit configuration in proximity thereto.

As shown in FIG. 21, a memory cell array 9 includes a plurality of memory cells MC.

The plurality of memory cells MC are arranged in an array form in the memory cell array 9. A plurality of bit lines BL, bBL and a plurality of word lines WL are arranged in the memory cell array 9. The bit lines BL, bBL extend in a column direction, and the word lines WL extend in a row direction. The two bit lines BL, bBL form a pair of bit lines.

The memory cell MC is connected to the bit lines BL, bBL and the word lines WL.

Each of the plurality of memory cells MC arranged in the column direction is connected to the common bit line pair BL, bBL. Each of the plurality of memory cells MC arranged in the row direction is connected to the common word line WL.

For example, the memory cell MC includes magnetoresistive effect element (MTJ element) 1 and a selection switch 2.

The MTJ element explained in the first to third embodiments is used as the MTJ element 1 in the memory cell MC. In the explanation below, the MTJ element according to the first embodiment is used as the MRAM. However, it is to be understood that the MTJ elements according to the second and third embodiments may also be used as the MRAM.

For example, the selection switch 2 is a field effect transistor. Hereinafter, the field effect transistor serving as the selection switch 2 will be referred to as a select transistor 2.

One end of the MTJ element 1 is connected to the bit line BL, and the other end of the MTJ element 1 is connected to one end of a current path of the select transistor 2 (source/drain). The other end of the current path of the select transistor 2 (drain/source) is connected to the bit line bBL. A control terminal (gate) of the select transistor 2 is connected to the word line WL.

One end of the word line WL is connected to a row control circuit 4. The row control circuit 4 controls activation/deactivation of a word line on the basis of an address signal provided from the outside.

One end and the other end of each of the bit lines BL, bBL is connected to column control circuits 3A, 3B. The column control circuits 3A, 3B controls activation/deactivation of a bit line on the basis of an address signal provided from the outside Write circuits 5A, 5B are respectively connected to one end and the other end of each bit line via the column control circuits 3A, 3B. The write circuits 5A, 5B respectively have a source circuit such as a voltage source and a current source for generating a write current and a sink circuit for absorbing the write current.

In the spin-transfer-torque MRAM, the write circuits 5A, 5B supplies a write current Iw to memory cell (hereinafter, selected cell) selected from the outside during data write operation. The write circuits 5A, 5B pass the write current Iw through the MTJ element 1 in the memory cell MC in both directions in accordance with data to be written to the selected cell. In other words, the write circuits 5A, 5B output the write current Iw passing from the bit line BL to the bit line bBL or the write current Iw passing from the bit line bBL to the bit line BL in accordance with the data to be written.

Read circuits 6A, 6B respectively are connected to one end and the other end of each of the bit lines BL, bBL via the column control circuits 3A, 3B. The read circuits 6A, 6B include a voltage source or a current source for generating a read current, a sense amplifier for detecting and amplifying a read signal, a latch circuit for temporarily holding data, and the like. The read circuits 6A, 6B supply a read current to a selected cell during data read operation. The read current is less than the write current Iw (reversal threshold value), so that the magnetization of the recording layer is not reversed by the read current.

The current or the potential at the read node differs according to the resistance of the MTJ element 1 to which the read current is supplied. On the basis of the amount of change according to the resistance, data stored in the MTJ element 1 are determined.

In the example as shown in FIG. 21, the read circuits 6A, 6B are provided at both ends in the column direction. Alternatively, only one read circuit may be provided at one end in the column direction.

FIG. 22 is a cross-sectional view illustrating an example of a structure of a memory cell MC arranged in the memory cell array 9.

The memory cell MC is formed in an active region AA of a semiconductor substrate 70. The active region AA is divided by insulating films 71 embedded in element isolation regions of the semiconductor substrate 70.

The upper end of the MTJ element 1 is connected to a bit line 76 (BL) via an upper electrode 52. The lower end of the MTJ element 1 is connected to a source/drain diffusion layer 64 of the select transistor 2 via the lower electrode 51 and a contact plug 72B. A source/drain diffusion layer 63 of the select transistor 2 is connected to a bit line 75 (bBL) via a contact plug 72A.

A gate electrode 62 is formed on the surface of the active region AA between the two source/drain diffusion layers 63, 64 with a gate insulating film 61 interposed therebetween. The gate electrode 62 extends in the row direction, and is used as the word line WL.

In this case, the MTJ element 1 is arranged immediately above the plug 72B. Alternatively, an intermediate interconnect layer may be used, and the MTJ element 1 may be arranged at a position displaced from the position immediately above the contact plug (for example, above the gate electrode of the select transistor).

FIG. 22 shows an example where one memory cell is provided in one active region AA. Alternatively, two memory cells may be arranged adjacent to each other in the column direction in one active region AA, so that two memory cells share one bit line bBL and the source/drain diffusion layer 23. This configuration reduces the cell size of the memory cell MC.

In FIG. 22, the selection transistor 2 is the field effect transistor having planar structure. However, the structure of the field effect transistor is not limited thereto. Alternatively, a three-dimensional structure field effect transistor such as a recess channel array transistor (RCAT) and a FinFET may be used as the select transistor. The RCAT has such a structure in which a gate electrode is embedded in a recess in a semiconductor region with a gate insulating film interposed therebetween. The FinFET has such a structure in which a gate electrode cross a strip-like semiconductor region (fin) in a grade separation manner with a gate insulating film interposed therebetween.

As explained in the first to third embodiments, the magnetoresistive effect element (MTJ element) according to each embodiment has heat resistance against high-temperature (about 350° C.), and the element characteristics of the MTJ element can be improved. In other words, difference between the resistance of the MTJ element in the low-resistance (parallel) state and the resistance of the MTJ element in the high-resistance (antiparallel) state is large. Therefore, there is a large difference in the amount of change of the potential or the current between the two static states, and accordingly, data stored in the MTJ element serving as the memory element can be read with a high degree of reliability. Therefore, the MRAM using the MTJ element according to the present embodiment can improve the reliability of data read operation in the MRAM.

(b) Manufacturing Method

A method for manufacturing the memory cell in the MRAM according the application example will be explained with reference to FIGS. 23 and 24.

FIGS. 23 and 24 illustrate a cross section taken in the column direction of the memory cell MC in each manufacturing step of the MRAM.

As shown in FIG. 23, for example, the isolation insulating films 71 having a shallow trench isolation (STI) structure are embedded into the semiconductor substrate 70, so that an element isolation regions are formed. The active regions AA are divided in the semiconductor substrate 70 by forming the element isolation regions.

Then, the select transistor 2 of the memory cell MC is formed on each active region AA on the semiconductor substrate 70. The steps for forming the select transistors are as follows.

The gate insulating film 61 is formed on the surface of the active region AA. The gate insulating film 61 is a silicon oxide film formed by the thermal oxidation method, for example. Subsequently, a conductive layer (for example, a polysilicon layer) is formed on the gate insulating film 21 by the chemical vapor deposition (CVD) method, for example.

The conductive layer is processed into a predetermined pattern using the photolithography technique and reactive ion etching (RIE) method, for example. As a result, the gate electrode 62 is formed on the gate insulating film 61. Since the gate electrode 62 is used as the word line, the gate electrode 62 is formed to extend in the row direction. Therefore, the gate electrode 62 is shared by a plurality of select transistors arranged along the row direction.

The source/drain diffusion layers 63, 64 are formed in the semiconductor substrate 70. The diffusion layers 63, 64 are formed by injecting impurities such as arsenic (As), phosphorus (P) into the semiconductor substrate 70 by the ion implantation method using the gate electrode 62 as a mask.

With the above steps, the select transistor 2 is formed on the semiconductor substrate 70. In addition, a step for forming a silicide layer on the upper surfaces of the gate electrode 62 and the diffusion layers 63, 64 may be further added.

Then, a first inter-layer insulating film 79A is deposited on the semiconductor substrate 70 to cover the select transistor 2 using the CVD method, for example. The upper surface of the inter-layer insulating film 33 is planarized using the chemical mechanical polishing (CMP) method.

In the inter-layer insulating film 79A, a contact hole is formed so that the upper surface of the source/drain diffusion layer 63 is exposed. For example, tungsten (W) or molybdenum (Mo) is filled in the formed contact hole, whereby the contact plug 72A is formed.

The metal film is deposited on the inter-layer insulating film 79A and the contact plug 72. The deposited metal film is processed into a predetermined shape using photolithography technique the RIE method. As a result, the bit line 75 (bBL) connected to the current path of the select transistor 2 is formed.

Thereafter, a second inter-layer insulating film 79B is deposited on the inter-layer insulating film 79A and the bit line 75B by the CVD method, for example. Then, a contact hole is formed in the inter-layer insulating films 79A, 79B so that the surface of the source/drain diffusion layer 64 is exposed. The contact plug 72B is embedded in the contact hole by the sputtering method or CVD method.

The constituent members of the magnetoresistive effect element 1A according to the present embodiment (MTJ element) are deposited in order on the inter-layer insulating film 79B and the contact plug 72B substantially in the same manner as the above explanation made with reference to FIGS. 3 and 4. The inter-layer insulating film 79B and the contact plug 72B are used as the substrate for forming the MTJ element 1A.

Then, as shown in FIG. 24, after the MTJ element is processed, an inter-layer insulating film (for example, $SiO_2$) 79C is formed using the CVD method, for example.

During the deposition of the inter-layer insulating film 79C, the processed MTJ element 1A is exposed to the temperature condition of 300° C. or more, for example.

As described above, the perpendicular magnetic film (for example, a TbCoFe film) in the magnetic layer (for example, a reference layer) of the MTJ element 1A according to the present embodiment includes the amorphous phases and the microcrystals (crystals of 1 nm or less). The TbCoFe film 21 including the amorphous phases and the microcrystals in the MTJ element 1A according to the present embodiment has heat resistance against high-temperature (350° C. or more). Therefore, even when high-temperature heat is applied, the entire Tb Co Fe film is not crystallized, and the amorphous phases do not disappear. Therefore, this prevents deterioration of the characteristics of the MTJ element caused by the crystallization of the TbCoFe film 21.

The interface layer (for example, a CoFeB/Ta/CoFeB film) is provided, in which the Ta film is inserted between the TbCoFe film 21 and the tunnel barrier layer 30. This prevents Tb in the TbCo Fe film 21 from diffusing into the tunnel barrier layer 30 and a portion in proximity to the interface between the tunnel barrier layer 30 and the reference layer 20 due to the heat applied during deposition of the inter-layer insulating film.

Thereafter, the bit line BL is formed on the inter-layer insulating film 79C using a well-known technique.

With the above manufacturing steps, the memory cell of the MRAM according to the application example is formed.

As explained with reference to FIGS. 21 to 24, the magnetoresistive effect element according to the present embodiment (MTJ element) can be applied to the MRAM. As described above, according to the magnetoresistive effect element according to the present embodiment (MTJ element), the MTJ element having improved element characteristics can be provided.

Therefore, the operational characteristics and reliability of the memory can be improved in the MRAM according to the application example by using the magnetoresistive effect element according to the present embodiment.

[Others]

The magnetoresistive effect element according to the first to third embodiments can improve the element characteristics.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive effect element comprising:
a first magnetic layer comprising perpendicular anisotropy to a film surface and an invariable magnetization direction, the first magnetic layer comprising a magnetic film including an element selected from a first group including Tb, Gd, and Dy and an element selected from a second group including Co and Fe;
a second magnetic layer comprising perpendicular magnetic anisotropy to the film surface and a variable magnetization direction; and
a nonmagnetic layer between the first magnetic layer and the second magnetic layer;
wherein the magnetic film includes amorphous phases and crystals whose particle sizes are 0.5 nm or more.

2. The magnetoresistive effect element of claim 1, wherein each of the crystals has at least one of a first lattice spacing from 0.12 to 0.16 nm and a second lattice spacing from 0.19 to 0.23 nm in a cross-sectional direction of the magnetic film.

3. The magnetoresistive effect element of claim 1, wherein each of the crystals includes an element selected from the second group, and
each of the amorphous phases includes an element selected from the first group and an element selected from the second group.

4. The magnetoresistive effect element of claim 1, wherein when the first magnetic layer includes both of Co and Fe among the elements of the second group, a concentration of Fe is higher than a concentration of Co.

5. The magnetoresistive effect element of claim 1, wherein the first magnetic layer comprises an interface layer between the magnetic film and the nonmagnetic layer, the interface layer includes an element selected from Co and Fe.

6. The magnetoresistive effect element of claim 5, wherein a metal film selected from a group including a Ta film, a W film, an Nb film, and an Mo film is inserted in the interface layer.

7. The magnetoresistive effect element of claim 5, wherein a metal film selected from a group including a Ta film, a W film, an Nb film, and an Mo film is inserted between the magnetic film and the interface layer.

8. The magnetoresistive effect element of claim 1, wherein an average crystal particle size of the crystals is 3 nm or less.

9. The magnetoresistive effect element of claim 1, further comprising:
an underlayer that is provided on the second magnetic layer at a side opposite to a side at which the nonmagnetic layer is provided, wherein the underlayer has an atom close-packed plane.

10. The magnetoresistive effect element of claim 1, further comprising:
a third magnetic layer that is provided at a side opposite to a side of the nonmagnetic layer of the first magnetic layer, wherein the third magnetic layer has perpendicular magnetic anisotropy to the film surface,
wherein a magnetization direction of the third magnetic layer is invariable, and a direction of the third magnetic layer is opposite to the magnetization direction of the first magnetic layer.

11. A magnetic memory comprising:
a memory cell comprising the magnetoresistive effect element of claim 1.

12. A magnetoresistive effect element comprising:
a first magnetic layer comprising perpendicular magnetic anisotropy to a film surface and an invariable magnetization direction, the first magnetic layer comprising a magnetic film including an element selected from a first group including Tb, Gd, and Dy and an element selected from a second group including Co and Fe, an interface layer between the magnetic film and a nonmagnetic layer, and an intermediate film in the interface layer and selected from a third group including a Ta film, a W film, an Nb film, and an Mo film;
a second magnetic layer comprising perpendicular magnetic anisotropy to the film surface and a variable magnetization direction; and
a nonmagnetic layer between the first magnetic layer and the second magnetic layer.

13. The magnetoresistive effect element of claim 12, wherein the interface layer includes an element selected from Co and Fe.

14. A magnetic memory comprising:
a memory cell comprising the magnetoresistive effect element of claim 12.

* * * * *